(12) United States Patent
Soneda et al.

(10) Patent No.: US 12,507,427 B2
(45) Date of Patent: Dec. 23, 2025

(54) SEMICONDUCTOR DEVICE

(71) Applicant: Mitsubishi Electric Corporation, Tokyo (JP)

(72) Inventors: Shinya Soneda, Tokyo (JP); Kenji Harada, Tokyo (JP); Kakeru Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 298 days.

(21) Appl. No.: 17/378,442

(22) Filed: Jul. 16, 2021

(65) Prior Publication Data

US 2022/0109061 A1 Apr. 7, 2022

(30) Foreign Application Priority Data

Oct. 1, 2020 (JP) .................... 2020-167171

(51) Int. Cl.
*H10D 12/00* (2025.01)
*H10D 62/10* (2025.01)
*H10D 62/17* (2025.01)

(52) U.S. Cl.
CPC ......... *H10D 12/421* (2025.01); *H10D 62/127* (2025.01); *H10D 62/393* (2025.01)

(58) Field of Classification Search
CPC ........... H01L 29/66325; H01L 29/7302; H01L 29/7393; H01L 29/7395; H01L 29/7397; H01L 29/0834; H01L 29/41708; H01L 29/41716; H01L 29/42376; H01L 29/42356; H01L 29/4236; H01L 29/66348; H01L 29/7396; H01L 29/7416; H01L 29/7325; H01L 29/66628; H01L 29/66333; H01L 21/324; H01L 21/425;
(Continued)

(56) References Cited

U.S. PATENT DOCUMENTS

2014/0070266 A1* 3/2014 Matsudai ............. H01L 29/407
257/139
2015/0380536 A1 12/2015 Kimura et al.
(Continued)

FOREIGN PATENT DOCUMENTS

CN 109964317 A 7/2019
CN 110785852 A 2/2020
(Continued)

OTHER PUBLICATIONS

Foreign Priority Application JP2020-006095, pp. 1-42. (Year: 2020).*
(Continued)

*Primary Examiner* — Natalia A Gondarenko
(74) *Attorney, Agent, or Firm* — Studebaker Brackett PLLC

(57) ABSTRACT

In plan view of an RC-IGBT, a boundary region has an occupancy rate of an $n^+$-type source layer per unit area, the occupancy rate being smaller than an occupancy rate of the $n^+$-type source layer per unit area in an IGBT region, and the boundary region has an occupancy rate of a $p^+$-type contact layer per unit area, the occupancy rate being smaller than an occupancy rate of the $p^+$-type contact layer per unit area in an IGBT region.

12 Claims, 24 Drawing Sheets

(58) Field of Classification Search
CPC ............... H01L 21/426; H01L 21/8222; H01L 21/3215; H01L 21/322; H01L 21/3223; H01L 27/0664; H01L 27/0716; H01L 27/0755; H01L 27/0761; H01L 23/34; H01L 23/3675; H01L 23/3677; H01L 23/46; H01L 23/467; H01L 23/473; H01L 23/49; H01L 2023/4018; H01L 2023/405; H01L 29/0839; H01L 29/861; H01L 2924/00014; H01L 24/40; H01L 24/48; H01L 2224/0603; H01L 2224/49175; H01L 2224/73221; H01L 29/0619; H01L 29/4238; H01L 29/16; H01L 29/407; H01L 29/8613; H01L 29/7394; H01L 29/0696; H01L 29/1095; H01L 29/0638; H01L 29/0692; H10D 8/045; H10D 8/422; H10D 30/66; H10D 30/668; H10D 12/031; H10D 12/032; H10D 12/038; H10D 12/411; H10D 12/421; H10D 12/441; H10D 12/461; H10D 12/481; H10D 64/117; H10D 64/20; H10D 64/231; H10D 64/251; H10D 64/252; H10D 64/512; H10D 64/519; H10D 62/149; H10D 62/154; H10D 62/155; H10D 62/177; H10D 62/292; H10D 62/393; H10D 84/0123; H10D 84/0126; H10D 84/101; H10D 84/135; H10D 84/141; H10D 84/143; H10D 84/146; H10D 84/148; H10D 84/161; H10D 84/406; H10D 84/613; H10D 84/8312; H10D 89/601; H10D 89/611; H10D 62/10; H10D 62/117; H10D 62/126; H10D 62/106; H10D 62/112; H10D 62/142; H10D 62/127; H10D 62/129; H10D 62/133; H10D 62/137; H10D 62/145

USPC ...... 257/139, 140, 329, 655, 21.334, 29.198
See application file for complete search history.

(56) References Cited

U.S. PATENT DOCUMENTS

| | | |
|---|---|---|
| 2017/0047319 A1* | 2/2017 | Naito ..................... H01L 29/868 |
| 2019/0067463 A1* | 2/2019 | Abe ...................... H01L 29/0696 |
| 2019/0252534 A1 | 8/2019 | Murakawa et al. |
| 2020/0035817 A1* | 1/2020 | Tamura ................ H10D 62/142 |
| 2020/0098747 A1 | 3/2020 | Tamura et al. |
| 2020/0251581 A1* | 8/2020 | Naito ................ H01L 29/41708 |
| 2022/0149191 A1* | 5/2022 | Shirakawa .......... H01L 29/8613 |
| 2022/0278094 A1* | 9/2022 | Yokoyama .......... H01L 29/7397 |

FOREIGN PATENT DOCUMENTS

| | | | | |
|---|---|---|---|---|
| DE | 112013006666 T5 | 10/2015 | | |
| JP | 2018-073911 A | 5/2018 | | |
| JP | 2020100458 A | * | 6/2020 | ............. H01L 27/06 |

OTHER PUBLICATIONS

An Office Action mailed by China National Intellectual Property Administration on Oct. 29, 2024, which corresponds to Chinese Patent Application No. 202111105778.5 and is related to U.S. Appl. No. 17/378,442; with English language translation.

An Office Action mailed by China National Intellectual Property Administration on May 7, 2025, which corresponds to Chinese Patent Application No. 202111105778.5 and is related to U.S. Appl. No. 17/378,442, with English language translation.

An Office Action issued by the German Patent and Trademark Office on May 24, 2025, which corresponds to German Patent Application No. 102021123446.8 and is related to U.S. Appl. No. 17/378,442; with English language translation.

An Office Action mailed by China National Intellectual Property Administration on Aug. 15, 2025, which corresponds to Chinese Patent Application No. 202111105778.5 and is related to U.S. Appl. No. 17/378,442; with English language translation.

* cited by examiner

F I G. 5
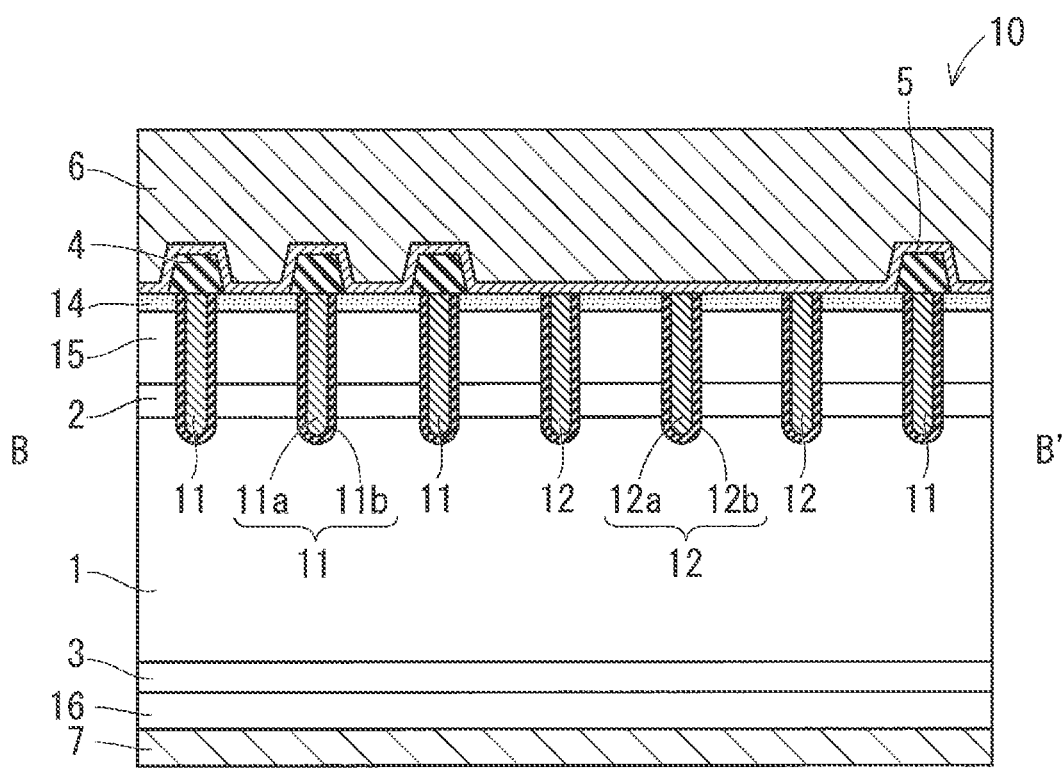

F I G. 14
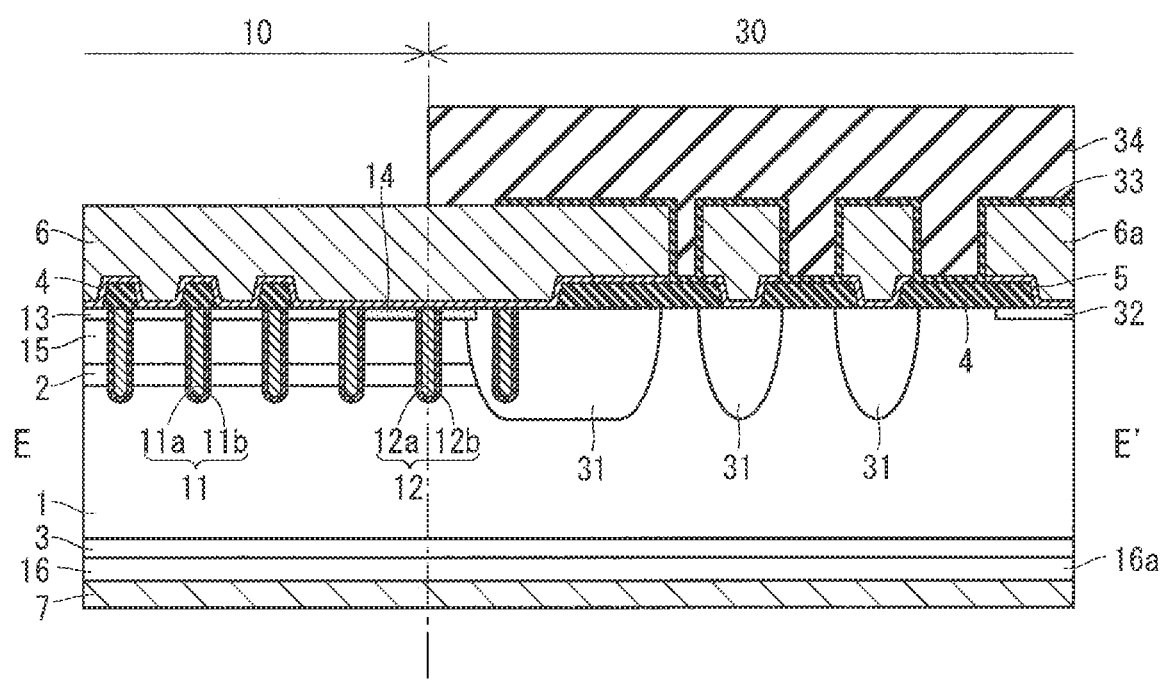

F I G. 2 4
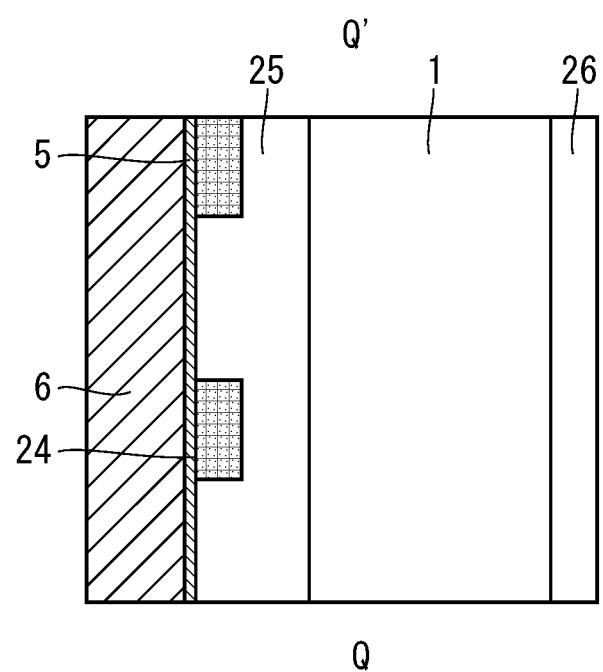

SEMICONDUCTOR DEVICE

BACKGROUND OF THE INVENTION

Field of the Invention

The present disclosure relates to a reverse conducting semiconductor device (RC-IGBT) in which a freewheeling diode and an insulated gate bipolar transistor (IGBT) are installed side by side.

DESCRIPTION OF THE BACKGROUND ART

The RC-IGBT has high hole injection efficiency in an IGBT cell, and thus causes a problem in that recovery loss increases due to hole injection from an IGBT region to a diode region.

To address this problem, a boundary region is conventionally provided between the IGBT region and the diode region with a structure in which a collector layer is disposed directly under a diode cell (e.g., Japanese Patent Application Laid-Open No. 2018-073911).

Unfortunately, the boundary region does not operate as an IGBT or a diode, and thus serves an invalid region that is not actively involved in energization operation. This causes a problem in that a sufficient boundary region cannot be secured and recovery loss cannot be reduced to secure an effective operating region necessary for securing a sufficient energizing capacity in a limited element region.

SUMMARY

It is an object of the technique of the present disclosure to reduce recovery loss while an operating region is secured in an RC-IGBT.

A semiconductor device of the present disclosure includes a semiconductor substrate. The semiconductor substrate includes a drift layer of a first conductivity type. In the semiconductor device of the present disclosure, an IGBT region and a diode region are disposed with a boundary region interposed therebetween in plan view. The semiconductor substrate has a first main surface, and a second main surface facing the first main surface. The IGBT region and the boundary region each include a base layer of a second conductivity type, a source layer of the first conductivity type, a first contact layer of the second conductivity type, and a collector layer of the second conductivity type. The base layer is formed on the first main surface side of the drift layer. The source layer is formed on the first main surface side of the base layer. The first contact layer is formed adjacent to the source layer on the first main surface side of the base layer, and has a higher concentration of impurities of the second conductivity type than the base layer. The collector layer is formed on the second main surface side of the drift layer. The diode region includes an anode layer of the second conductivity type and a cathode layer of the first conductivity type. The anode layer is formed on the first main surface side of the drift layer. The cathode layer is formed on the second main surface side of the drift layer. In plan view, the boundary region has an occupancy rate of the source layer per unit area, the occupancy rate being smaller than an occupancy rate of the source layer per unit area in the IGBT region, and the boundary region has an occupancy rate of the first contact layer per unit area, the occupancy rate being smaller than an occupancy rate of the first contact layer per unit area in the IGBT region.

The semiconductor device of the present disclosure enables reducing recovery loss while securing an operating region of an IGBT because the occupancy rate of the first contact layer per unit area in the boundary region is smaller than the occupancy rate of the first contact layer per unit area in the IGBT region.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a sectional view of the IGBT region taken along line B-B' of FIG. 3;
FIG. 14 is a sectional view of the IGBT region and a terminal region taken along line E-E' of FIG. 1 or 2;
FIG. 24 is a sectional view of the boundary region of the sixth preferred embodiment taken along line Q-Q' of FIG. 23.

DESCRIPTION OF THE PREFERRED EMBODIMENTS

A. First Preferred Embodiment

A-1. Planar Structure of RC-IGBT

Figure 1:
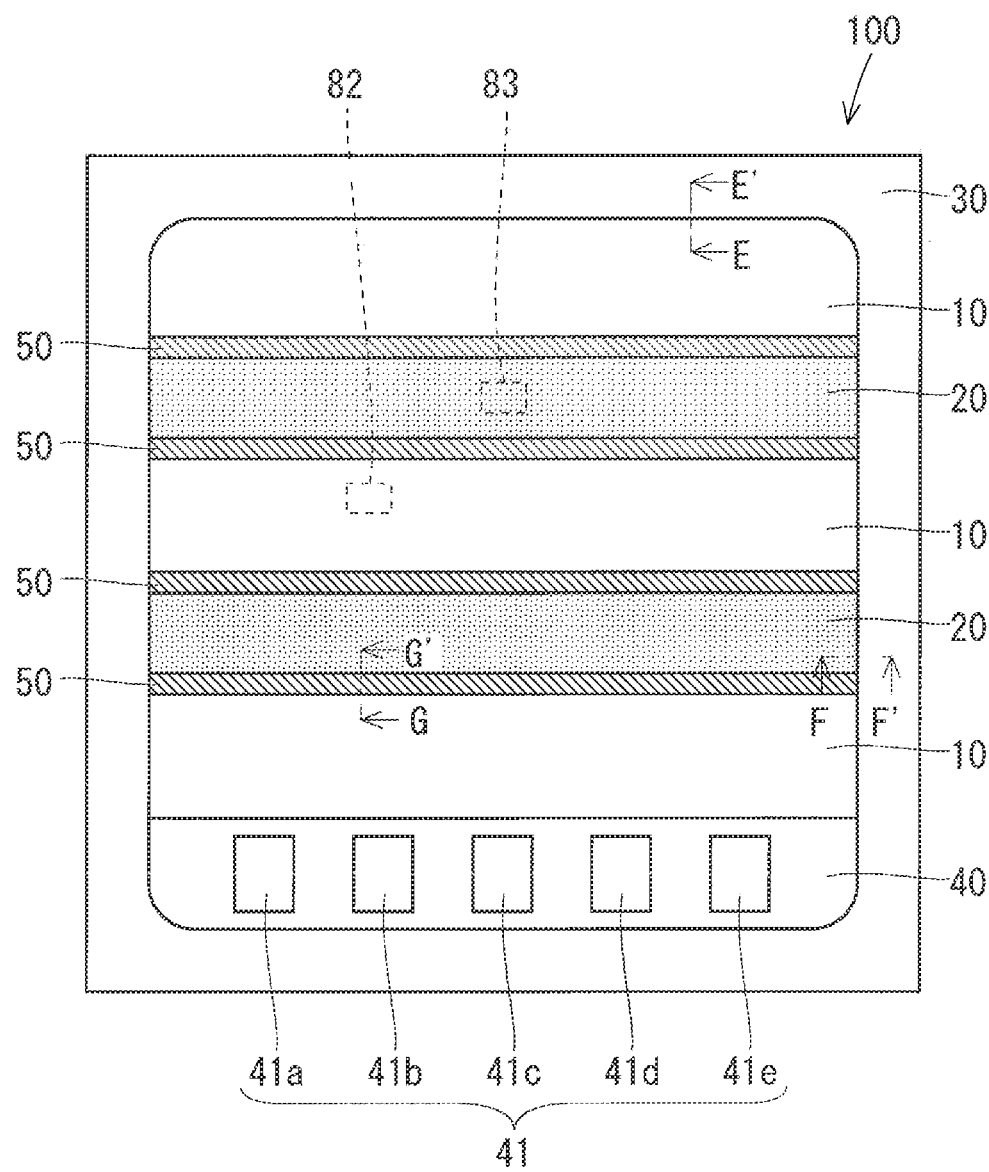
FIG. 1 is a plan view of an RC-IGBT of a stripe type.
Figure 2:
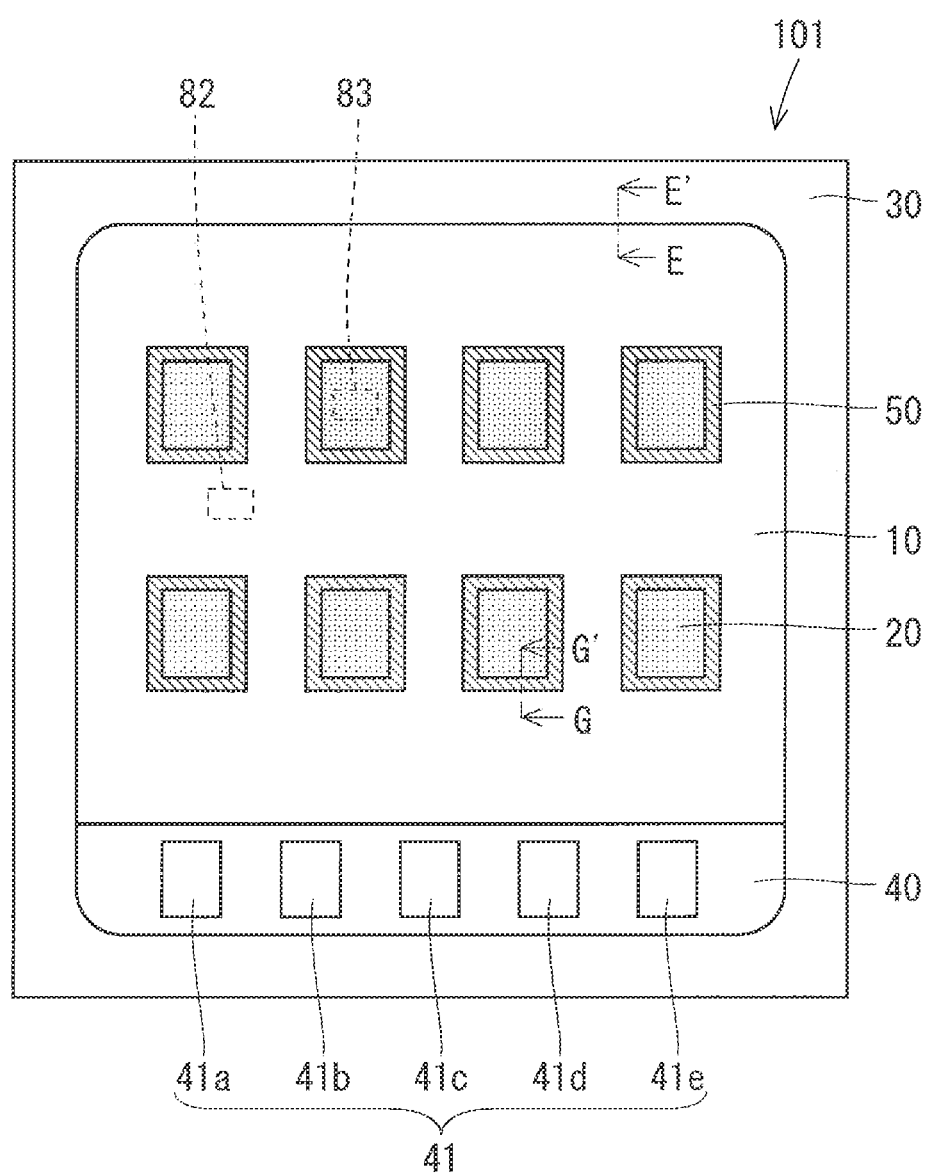
FIG. 2 is a plan view of an RC-IGBT of an island type.

FIG. 1 is a plan view of a reverse conducting IGBT (RC-IGBT) 100 that is a semiconductor device of a first preferred embodiment. FIG. 2 is a plan view of an RC-IGBT 101 that is a semiconductor device of the first preferred embodiment, being different in structure from the RC-IGBT 100.

The RC-IGBT 100 has an IGBT region 10 and a diode region 20 arranged in stripe shape, and thus is also referred to as a "stripe type". The RC-IGBT 101 has a structure in which an IGBT region 10 surrounds a plurality of diode regions 20, and thus is also referred to as an "island type".

A-2. Planar Structure of Stripe Type

With reference to FIG. 1, a planar structure of the RC-IGBT 100 of a stripe type will be described. The RC-IGBT 100 includes the IGBT region 10, the diode region 20, a terminal region 30, a pad region 40, and a boundary region 50. The RC-IGBT 100 includes the IGBT region 10 and the diode region 20 that are disposed with the boundary region 50 interposed therebetween in plan view, and the same also applies to the RC-IGBT 101 described later. The IGBT region 10, the diode region 20, and the boundary region 50 extend from one end toward the other end of the RC-IGBT 100. The mar region 10 and the diode region 20 are alternately provided in a stripe shape across the boundary region 50 in a direction orthogonal to the extension direction thereof.

FIG. 1 illustrates three IGBT regions 10 and two diode regions 20, and each diode region 20 is sandwiched between the IGBT regions 10 with boundary regions 50 interposed therebetween. However, the number of IGBT regions 10 and diode regions 20 is not limited to this. The number of IGBT regions 10 may be three or more, or three or less, and the number of diode regions 20 may be two or more, or two or less. Positions of the IGBT regions 10 and the diode regions 20 in FIG. 1 may be exchanged, and all the IGBT regions 10 may be sandwiched between the diode regions 20 with boundary regions 50 interposed therebetween. The RC-IGBT 100 may have a structure in which one IGBT region 10 and one diode region 20 are provided adjacent to each other with a boundary region 50 interposed therebetween.

In FIG. 1, the boundary regions 50 are provided in all regions between the IGBT regions 10 and the respective diode regions 20. However, the boundary region 50 may be provided at least partly between the IGBT region 10 and the diode region 20. The boundary region 50 may be provided between the diode region 20 and the terminal region 30.

As illustrated in FIG. 1, the pad region 40 is provided adjacent to a lower side of the IGBT region 10 in the drawing, the IGBT region 10 being lowest in the drawing. The pad region 40 is a region in which a control pad 41 for controlling the RC-IGBT 100 is provided. The IGBT region 10 and the diode region 20 are collectively referred to as a cell region. The terminal region 30 is provided around a region including the cell region and the pad region 40 to hold withstand voltage of the RC-IGBT 100. The terminal region 30 may be provided with a well-known withstand voltage holding structure that is appropriately selected. The withstand voltage holding structure is provided on a first main surface side, or a front surface side, of the RC-IGBT 100. The withstand voltage holding structure may be a field limiting ring (FLR) in which the cell region is surrounded by a p-type terminal well layer of a p-type semiconductor, or a variation of lateral doping (VLD) in which the cell region is surrounded by a p-type well layer with a concentration gradient. The number of p-type terminal well layers in the shape of a ring used for the FLR and concentration distribution used for the VLD may be appropriately selected depending on withstand voltage design of the RC-IGBT 100. The p-type terminal well layer may be provided almost throughout the pad region 40. The pad region 40 may be provided with an IGBT cell or a diode cell.

Examples of the control pad 41 includes a current sense pad 41a, a Kelvin emitter pad 41b, a gate pad 41c, and temperature sense diode pads 41d, 41e. The current sense pad 41a is a control pad that is configured to detect a current flowing in the cell region of the RC-IGBT 100, and that is electrically connected to some of IGBT cells or diode cells in the cell region to allow a current to flow through the cell region of the RC-IGBT 100 such that a current of several tenths to several tens of thousandths flowing through the entire cell region flows through some of the IGBT cells or the diode cells.

The Kelvin emitter pad 41b and the gate pad 41c are each a control pad to which gate drive voltage for on-off control of the RC-IGBT 100 is applied. The Kelvin emitter pad 41b is electrically connected to a p-type base layer 15 of the IGBT cell, and the gate pad 41c is electrically connected to a gate trench electrode 11a of the IGBT cell. The Kelvin emitter pad 41b and the p-type base layer 15 may be electrically connected with a $p^+$-type contact layer 14 interposed therebetween. The temperature sense diode pads 41d, 41e are control pads electrically connected to an anode and a cathode of the temperature sense diode provided in the RC-IGBT 100. The temperature sense diode pads 41d, 41e measure voltage between the anode and the cathode of the temperature sense diode (not illustrated) provided in the cell region to measure temperature of the RC-IGBT 100.

A-3. Planar Structure of Island Type

With reference to FIG. 2, a planar structure of the RC-IGBT 101 of an island type will be described.

The RC-IGBT 101 includes the IGBT region 10, the diode regions 20, a terminal region 30, a pad region 40, and a boundary region 50. The diode regions 20 are disposed side by side in the RC-IGBT 101 not only in a longitudinal direction (a vertical direction in FIG. 2) but also in a lateral direction (a left-right direction in FIG. 2). Each diode region 20 is surrounded by the IGBT region 10 with the boundary region 50 interposed therebetween. That is, the diode regions 20 are provided in an island shape in the IGBT region 10.

FIG. 2 illustrates eight diode regions 20 provided in a matrix with four columns in the longitudinal direction and two rows in the lateral direction. However, the number and placement of the diode regions 20 are not limited to this. At least one diode region 20 may be provided at a place in the IGBT region 10, and each diode region 20 may be surrounded by the IGBT region 10.

In FIG. 2, the boundary regions 50 are provided in all regions between the IGBT region 10 and the respective diode regions 20. However, the boundary region 50 may be provided at least partly between the IGBT region 10 and the diode region 20.

As illustrated in FIG. 2, the pad region 40 is provided adjacent to a lower side of the IGBT region 10 in the drawing. This pad region 40 is identical in structure to the pad region 40 in the RC-IGBT of a stripe type, and thus is not described here.

A-4. General Structure of IGBT Region

Figure 3:
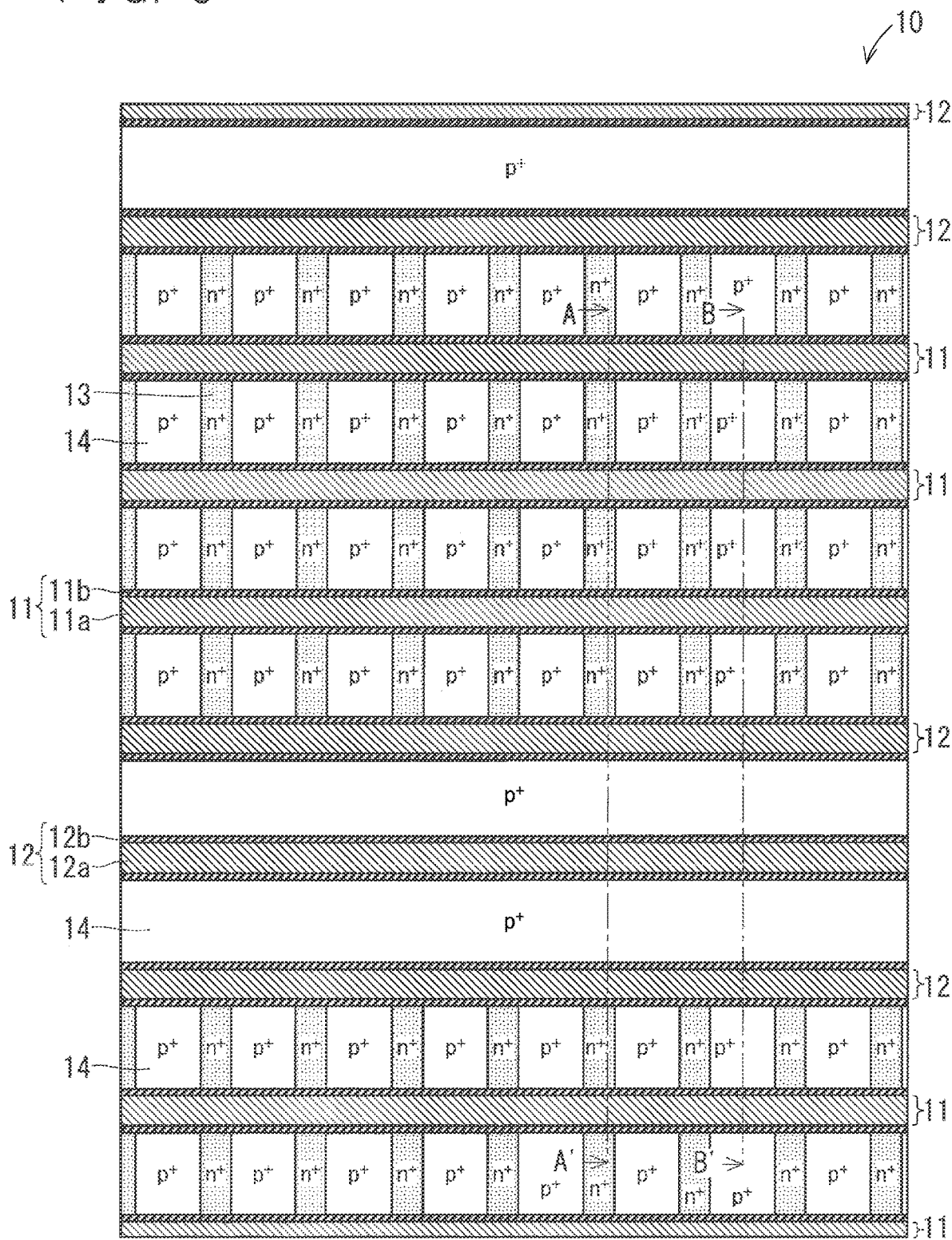
FIG. 3 is a plan view of an IGBT region.

FIG. 3 is an enlarged plan view of the IGBT region 10 surrounded by a broken line 82 of the RC-IGBT' 100, 101 in FIG. 1 or 2.

As illustrated in FIG. 3, the IGBT region 10 includes an active trench gate 11, a dummy trench gate 12, an n$^+$-type source layer 13, and a p$^+$-type contact layer 14.

The active trench gate 11 and the dummy trench gate 12 pass through the p-type base layer 15 from the first main surface of the semiconductor substrate and reach an n$^-$-type drift layer 1. The active trench gate 11 and the dummy trench gate 12 are also collectively referred to as simply a trench gate. The active trench gate 11 and the dummy trench gate 12 are provided in a stripe shape. The RC-IGBT 100 is configured such that the active trench gate 11 and the dummy trench gate 12 extend in a longitudinal direction (left-right direction in FIG. 3) of the IGBT region 10, and the longitudinal direction of the IGBT region 10 corresponds to a longitudinal direction of each of the active trench gate 11 and the dummy trench gate 12. In contrast, the RC-IGBT 101 is configured such that the IGBT region 10 has a longitudinal direction and a lateral direction that are not particularly distinguished, and a left-right direction in FIG. 2 may correspond to the longitudinal direction of the active trench gate 11 and the dummy trench gate 12, or a vertical direction in FIG. 2 may correspond to the longitudinal direction of the active trench gate 11 and the dummy trench gate 12.

An extension direction of each of the active trench gate 11 and the dummy trench gate 12 is also referred to as a first direction. In other words, the active trench gate 11 and the dummy trench gate 12 extend in the first direction. The active trench gate 11 and the dummy trench gate 12 are arranged in a second direction orthogonal to the first direction.

The active trench gate 11 includes a gate trench insulating film 11b formed on an inner wall surface of a trench formed in the semiconductor substrate in the IGBT region 10, and a gate trench electrode 11a provided in the trench, being covered with the gate trench insulating film 11b. The dummy trench gate 12 includes a dummy trench insulating film 12b formed on an inner wall surface of a trench formed in the semiconductor substrate, and a dummy trench electrode 12a provided in the trench, being covered with the dummy trench insulating film 12b. The gate trench electrode 11a of the active trench gate 11 is electrically connected to the gate pad 41c. The dummy trench electrode 12a of the dummy trench gate 12 is electrically connected to an emitter electrode 6 provided on the first main surface of the RC-IGBT 100, 101.

The n$^+$-type source layer 13 is provided in contact with the gate trench insulating film 11b on each side of the active trench gate 11 in its width direction. The n$^+$-type source layer 13 is a semiconductor layer having, for example, arsenic or phosphorus as n-type impurities, and the n-type impurities have a concentration of $1.0 \times 10^{17}/cm^3$ or more and $1.0 \times 10^{20}/cm^3$ or less. The n$^+$-type source layer 13 is provided alternately with a p$^+$-type contact layer 14 along an extension direction of the active trench gate 11. The p$^+$-type contact layer 14 is provided not only on both sides of the active trench gate 11 but also between two adjacent dummy trench gates 12. The p$^+$-type contact layer 14 is a semiconductor layer having, for example, boron or aluminum as p-type impurities, and the p-type impurities have a concentration of $1.0 \times 10^{15}/cm^3$ or more and $1.0 \times 10^{20}/cm^3$ or less.

As illustrated in FIG. 3, in the IGBT region 10, a set consisting of three active trench gates 11 and a set consisting of three dummy trench gates 12 are alternately disposed. The number of active trench gates 11 included in one set of active trench gates 11 is not limited to three, and may be one or more. Similarly, the number of dummy trench gates 12 included in one set of dummy trench gates 12 is not limited to three, and may be one or more. Furthermore, the number of dummy trench gates 12 may be zero. That is, all of trenches provided in the IGBT region 10 may be active trench gates 11.

Figure 4:
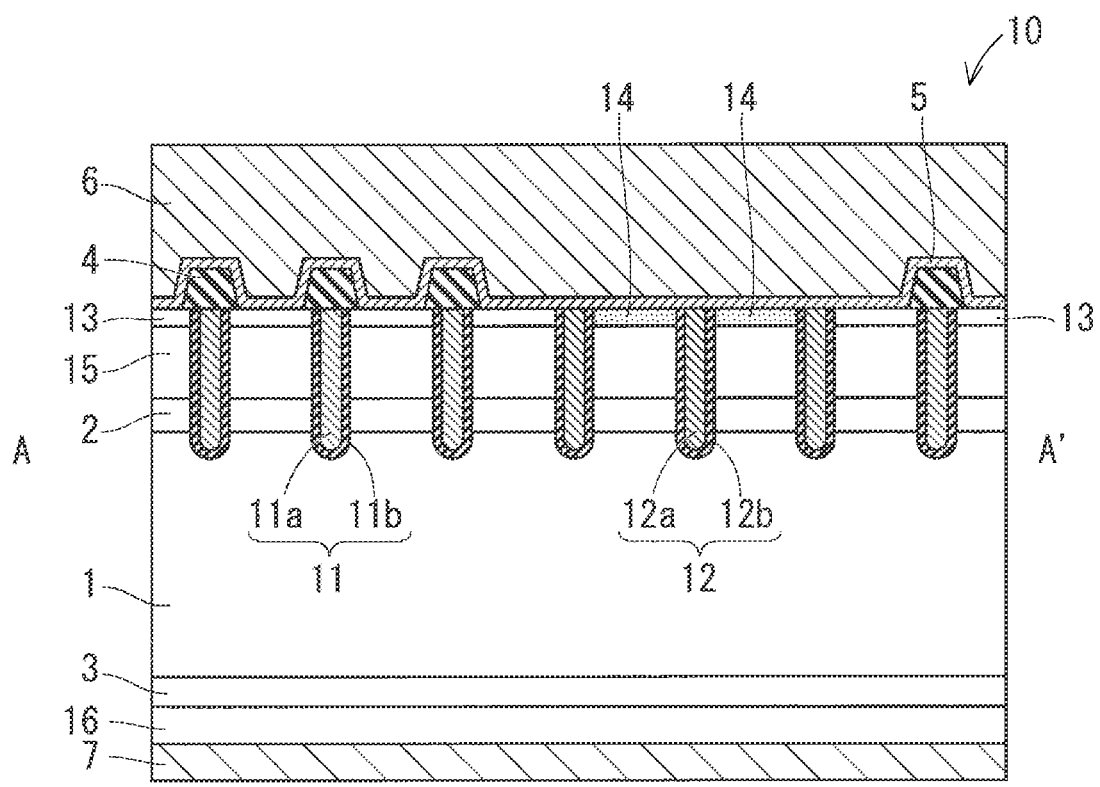
FIG. 4 is a sectional view of the IGBT region taken along line A-A' of FIG. 3.

FIG. 4 is a sectional view of the IGBT region 10 taken along line A-A' of FIG. 3, As illustrated in FIG. 4, the IGBT region 10 of the RC-IGBT 100, 101 has the n$^-$-type drift layer 1 composed of a semiconductor substrate. The n$^-$-type drift layer 1 is a semiconductor layer having, for example, arsenic or phosphorus as n-type impurities, and the n-type impurities have a concentration of $1.0 \times 10^{12}/cm^3$ or more and $1.0 \times 10^{15}/cm^3$ or less.

In FIG. 4, the semiconductor substrate ranges from the n$^+$-type source layer 13 and the p$^+$-type contact layer 14 to a p-type collector layer 16. That is, in the IGBT region 10, the semiconductor substrate includes the n$^-$-type drift layer 1, an n-type carrier storage layer 2, the p-type base layer 15, the n$^+$-type source layer 13, the p$^+$-type contact layer 14, an n-type buffer layer 3, and the p-type collector layer 16. FIG. 4 illustrates the n$^+$-type source layer 13 and the p$^+$-type contact layer 14 each having an upper end surface that is referred to as the first main surface of the semiconductor substrate, and the p-type collector layer 16 having a lower end surface that is referred to as the second main surface of the semiconductor substrate.

The first main surface of the semiconductor substrate is the main surface on a front surface side of the RC-IGBT 100, 101, and the second main surface of the semiconductor substrate is the main surface on a back surface side of the RC-IGBT 100, 101. The RC-IGBT 100, 101 includes the n$^-$-type drift layer 1 between the first main surface and the second main surface facing the first main surface in the IGBT region 10 being the cell region.

As illustrated in FIG. 4, the IGBT region 10 includes the n-type carrier storage layer 2 that is provided on the first main surface side of the n$^-$-type drift layer 1, and that has a higher concentration of n-type impurities than the n$^-$-type drift layer 1. The n-type carrier storage layer 2 is a semiconductor layer having, for example, arsenic or phosphorus as n-type impurities, and the n-type impurities have a concentration of $1.0 \times 10^{13}/cm^3$ or more and $1.0 \times 10^{17}/cm^3$ or less. The n-type carrier storage layer 2 is formed such that n-type impurities are ion-implanted into the semiconductor substrate constituting the n$^-$-type drift layer 1, and then n-type impurities injected by annealing are spread into the semiconductor substrate being the n$^-$-type drift layer 1. The n-type carrier storage layer 2 enables reducing electric power loss when a current flows in the IGBT region 10. The n-type carrier storage layer 2 and the n$^-$-type drift layer 1 may be collectively referred to as a drift layer.

The RC-IGBT 100, 101 may not include the n-type carrier storage layer 2 in the IGBT region 10, In this case, the n$^-$-type drift layer 1 is also provided in the region of the n-type carrier storage layer 2 in FIG. 4.

The p-type base layer 15 is provided on the first main surface side of the n-type carrier storage layer 2. The p-type base layer 15 is a semiconductor layer having, for example, boron or aluminum as p-type impurities, and the p-type impurities have a concentration of $1.0\times10^{12}/cm^3$ or more and $1.0\times10^{19}/cm^3$ or less. The p-type base layer 15 is in contact with the gate trench insulating film lib of the active trench gate 11 and the dummy trench insulating film 12b of the dummy trench gate 12. The p-type base layer 15 is provided on its first a main surface side with the $n^+$-type source layer 13 in contact with the gate trench insulating film 11b of the active trench gate 11, and the $p^+$-type contact layer 14 is provided in a region other than the $n^+$-type source layer 13 while being adjacent to the $n^+$-type source layer 13. The $n^+$-type source layer 13 and the $p^+$-type contact layer 14 constitute the first main surface of the semiconductor substrate. The $p^+$-type contact layer 14 is a region having a higher concentration of p-type impurities than the p-type base layer 15. When the $p^+$-type contact layer 14 and the p-type base layer 15 are not required to be distinguished from each other, they may be collectively referred to as a p-type base layer.

The $n^-$-type drift layer 1 is provided on its second main surface side with the n-type buffer layer 3 having a higher concentration of n-type impurities than the $n^-$-type drift layer 1. The n-type buffer layer 3 is provided to prevent a depletion layer extending from the p-type base layer 15 toward the second main surface from punching through when the RC-IGBT 100, 101 is turned off. The n-type buffer layer 3 is formed, for example, by injecting any one of or both of phosphorus (P) and protons ($H^+$) into the semiconductor substrate constituting the $n^-$-type drift layer 1. The n-type buffer layer 3 contains n-type impurities having a concentration of $1.0\times10^{12}/cm^3$ or more and $1.0\times10^{18}/cm^3$ or less. The n-type buffer layer 3 and the $n^-$-type drift layer 1 may be collectively referred to as a drift layer.

The RC-IGBT 100, 101 may not include the n-type buffer layer 3 in the IGBT region 10. In this case, the $n^-$-type drift layer 1 is also provided in the region of the n-type buffer layer 3 in FIG. 4.

The p-type collector layer 16 is provided on the second main surface side of the n-type buffer layer 3. That is, the p-type collector layer 16 is provided between the $n^-$-type drift layer 1 and the second main surface. The p-type collector layer 16 is a semiconductor layer having, for example, boron or aluminum as p-type impurities, and the p-type impurities have a concentration of $1.0\times10^{16}/cm^3$ or more and $1.0\times10^{20}/cm^3$ or less. The p-type collector layer 16 constitutes the second main surface of the semiconductor substrate. The p-type collector layer 16 is provided not only in the IGBT region 10 but also in the terminal region 30, and the p-type collector layer 16 includes a portion provided in the terminal region 30, the portion constituting a p-type terminal collector layer 16a. The p-type collector layer 16 may partially protrude from the IGBT region 10 to the diode region 20.

As illustrated in FIG. 4, the IGBT region 10 is provided with a plurality of trenches that passes through the p-type base layer 15 from the first main surface of the semiconductor substrate and reaches the n'-type drift layer 1. When the gate trench electrode 11a covered with the gate trench insulating film 11b is provided in each of some of the trenches, the active trench gate 11 is formed. The gate trench electrode 11a faces the n'-type drift layer 1 with the gate trench insulating film 11b interposed therebetween. When the dummy trench electrode 12a covered with the dummy trench insulating film 12b is provided in each of some of the other trenches, the dummy trench gate 12 is formed. The dummy trench electrode 12a faces the $n^-$-type drift layer 1 with the dummy trench insulating film 12b interposed therebetween. The gate trench insulating film 11b of the active trench gate 11 is in contact with the p-type base layer 15 and the $n^+$-type source layer 13. When gate drive voltage is applied to the gate trench electrode 11a, a channel is formed in the p-type base layer 15 in contact with the gate trench insulating film 11b of the active trench gate 11.

As illustrated in FIG. 4, an interlayer insulating film 4 is provided on the gate trench electrode 11a of the active trench gate 11. A barrier metal 5 is formed on a region where the interlayer insulating film 4 is not provided on the first main surface of the semiconductor substrate and on the interlayer insulating film 4. The barrier metal 5 may be, for example, a conductor containing titanium (Ti) that may be titanium nitride, or TiSi obtained by alloying titanium and silicon (Si), for example. As illustrated in FIG. 4, the barrier metal 5 is in ohmic contact with the $n^+$-type source layer 13, the $p^+$-type contact layer 14, and the dummy trench electrode 12a, and is electrically connected to the $n^+$-type source layer 13, the $p^+$-type contact layer 14, and the dummy trench electrode 12a.

In the IGBT region 10, the emitter electrode 6 is provided on the barrier metal 5. The emitter electrode 6 may be formed of, for example, an aluminum alloy such as an aluminum silicon alloy (Al—Si based alloy). The emitter electrode 6 may be a plurality of layers composed of an electrode formed of an aluminum alloy and a plating film formed on the electrode by electroless plating or electrolytic plating. The plating film formed by electroless plating or electrolytic plating may be a nickel (Ni) plating film, for example. In a fine region such as a region between adjacent interlayer insulating films 4 where good embedding cannot be obtained with the emitter electrode 6, tungsten having better embedding properties than the emitter electrode 6 may be disposed to provide the emitter electrode 6 on the tungsten.

The RC-IGBT 100, 101 may be configured such that the IGBT region 10 includes no barrier metal 5, and the emitter electrode 6 is provided directly on the $n^+$-type source layer 13, the $p^+$-type contact layer 14, and the dummy trench electrode 12a. The barrier metal 5 may be provided only on an n-type semiconductor layer like the $n^+$-type source layer 13. The barrier metal 5 and the emitter electrode 6 may be collectively referred to as an emitter electrode.

Although in FIG. 4, the interlayer insulating film 4 is not formed on the dummy trench electrode 12a of the dummy trench gate 12, the interlayer insulating film 4 may be formed on the dummy trench electrode 12a of the dummy trench gate 12. When the interlayer insulating film 4 is formed on the dummy trench electrode 12a of the dummy trench gate 12, the emitter electrode 6 and the dummy trench electrode 12a may be electrically connected in a section other than the section A-A illustrated in FIG. 4.

A collector electrode 7 is provided on the second main surface side of the p-type collector layer 16. As with the emitter electrode 6, the collector electrode 7 may be formed of an aluminum alloy, or may be a plurality of layers composed of an aluminum alloy and a plating film. The collector electrode 7 may be different in structure from the emitter electrode 6. The collector electrode 7 is in ohmic contact with the p-type collector layer 16 and is electrically connected to the p-type collector layer 16.

FIG. 5 is a sectional view of the IGBT region 10 taken along line B-B' of FIG. 3. FIG. 5 illustrates a sectional structure that is different from a sectional structure of the IGBT region 10 of FIG. 4 taken along line A-A' of FIG. 3 in that the semiconductor substrate is provided on its first main surface side with the p$^+$-type contact layer 14 that is in contact with the gate trench insulating film 11b of the active trench gate 11 instead of the n$^+$-type source layer 13. That is, as illustrated in FIG. 4, the n$^+$-type source layer 13 is selectively provided on the first main surface side of the p-type base layer. The p-type base layer referred to here is that the p-type base layer 15 and the p$^+$-type contact layer 14 are collectively referred to as the p-type base layer.

A-5. General Structure of Diode Region

Figure 6:
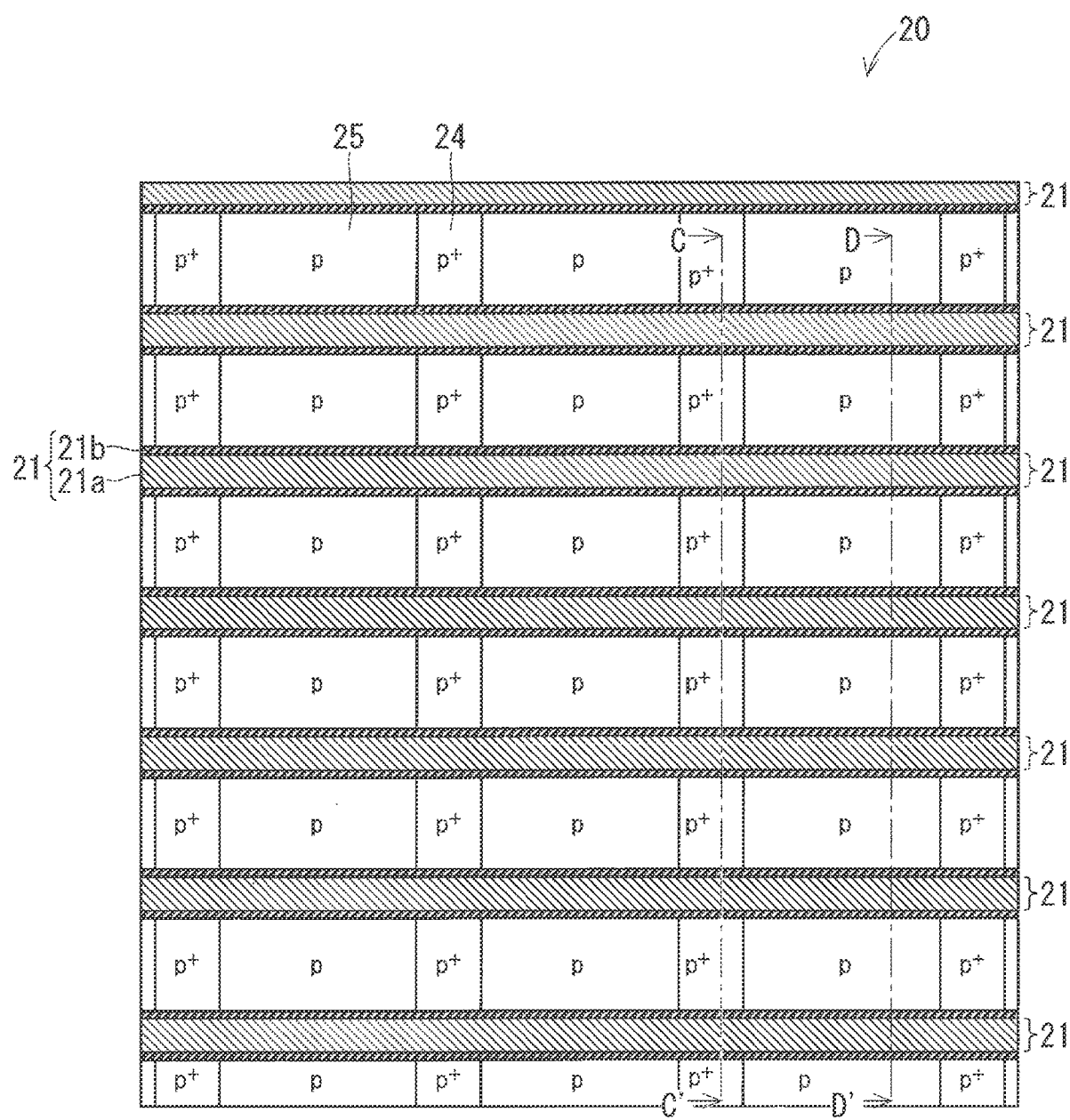
FIG. 6 is a plan view of a diode region.

FIG. 6 is a plan view of the diode region 20, being acquired by enlarging the region of the RC-IGBT 100, 101 surrounded by a broken line 83 in FIG. 1 or 2. As illustrated in FIG. 6, the diode region 20 includes a diode trench gate 21 being a first dummy trench gate, a p$^+$-type contact layer 24, and a p-type anode layer 25.

The diode trench gate 21 is provided along the first main surface of the RC-IGBT 100, 101 while extending from one end side of the diode region 20 being the cell region toward the other end facing the one end. The diode trench gate 21 includes a diode trench insulating film 21b formed on an inner wall surface of a trench formed in the semiconductor substrate in the diode region 20, and a diode trench electrode 21a provided in the trench, being covered with the diode trench insulating film 21b. The diode trench gate 21 passes through the p-type anode layer 25 from the first main surface of the semiconductor substrate and reaches the n$^-$-type drift layer 1. The diode trench gate 21 extends in the first direction as in the active trench gate 11 and the dummy trench gate 12 in the IGBT region 10 and the boundary region 50, and diode trench gates 21 are arranged in the second direction.

The diode trench electrode 21a faces the n$^-$-type drift layer 1 with the diode trench insulating film 21b interposed therebetween. Between two adjacent diode trench gates 21, p$^+$-type contact layers 24 and p-type anode layers 25 are alternately provided in a longitudinal direction of each of the diode trench gates 21. The p$^+$-type contact layer 24 is a semiconductor layer having, for example, boron or aluminum as p-type impurities, and the p-type impurities have a concentration of $1.0 \times 10^{15}/cm^3$ or more and $1.0 \times 10^{20}/cm^3$ or less. The p-type anode layer 25 is a semiconductor layer formed on the first main surface side of the n-type drift layer 1 and having, for example, boron or aluminum as p-type impurities, and the p-type impurities have a concentration of $1.0 \times 10^{12}/cm^3$ or more and $1.0 \times 10^{19}/cm^3$ or less.

Figure 7:
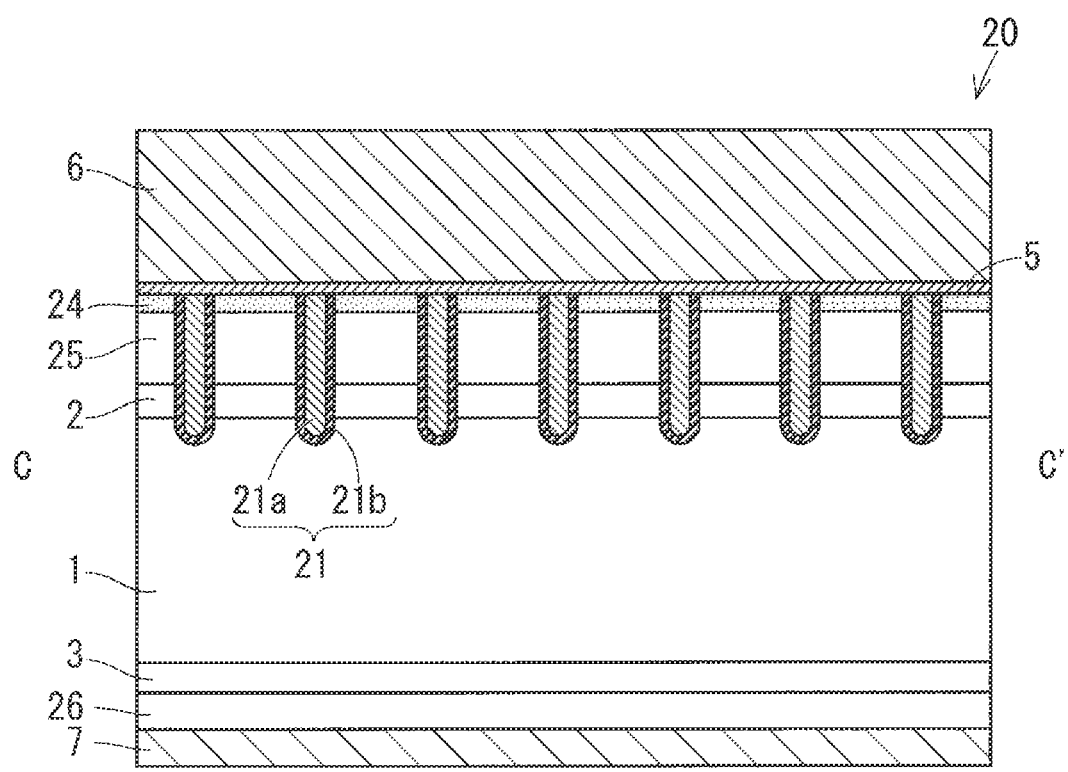
FIG. 7 is a sectional view of the diode region taken along line C-C of FIG. 6.

FIG. 7 is a sectional view of the diode region 20 taken along line C-C' of FIG. 6. The RC-IGBT 100, 101 includes the diode region 20 that also has the n$^-$-type drift layer 1 composed of a semiconductor substrate as with the IGBT region 10. The n$^-$-type drift layer 1 in the diode region 20 and the n$^-$-type drift layer 1 in the IGBT region 10 are continuously and integrally formed using an identical semiconductor substrate.

In FIG. 7, the semiconductor substrate ranges from the p$^+$-type contact layer 24 to an n$^+$-type cathode layer 26. That is, in the diode region 20, the semiconductor substrate includes the n-type drift layer 1, the n-type carrier storage layer 2, the p-type anode layer 25, the p$^+$-type contact layer 24, the n-type buffer layer 3, and the n$^+$-type cathode layer 26. FIG. 7 illustrates the p$^+$-type contact layer 24 having an upper end surface that is referred to as the first main surface of the semiconductor substrate, and the n$^+$-type cathode layer 26 having a lower end surface that is referred to as the second main surface of the semiconductor substrate. The first main surface of the semiconductor substrate in the diode region 20 and the first main surface of the semiconductor substrate in the IGBT region 10 are flush with each other, and the second main surface of the semiconductor substrate in the diode region 20 and the second main surface of the semiconductor substrate in the IGBT region 10 are flush with each other.

As illustrated in FIG. 7 and as with the IGBT region 10, even the diode region 20 includes the n-type carrier storage layer 2 provided on the first main surface side of the n$^-$-type drift layer 1, and the n-type buffer layer 3 provided on the second main surface side of the n$^-$-type drift layer 1, The n-type carrier storage layer 2 and the n-type buffer layer 3 provided in the diode region 20 are identical in structure to the n-type carrier storage layer 2 and the n-type buffer layer 3 provided in the IGBT region 10, respectively. The RC-IGBT 100, 101 may have a structure without the n-type carrier storage layer 2 in the diode region 20 regardless of whether or not the IGBT region 10 includes the n-type carrier storage layer 2. As in the IGBT region 10, the n$^-$-type drift layer 1, the n-type carrier storage layer 2, and the n-type buffer layer 3 may be collectively referred to as a drift layer even in the diode region 20.

In the diode region 20, the p-type anode layer 25 is provided on the first main surface side of the n-type carrier storage layer 2. The p-type anode layer 25 is provided between the n$^-$-type drift layer 1 and the first main surface. The p-type anode layer 25 may have a concentration of p-type impurities, being identical to a concentration of p-type impurities in the p-type base layer 15 in the IGBT region 10. In this case, the p-type anode layer 25 and the p-type base layer 15 can be formed at the same time. The p-type anode layer 25 may have a concentration of p-type impurities, being lower than the concentration of p-type impurities in the p-type base layer 15 in the IGBT region 10. In this case, the number of positive holes to be injected into the diode region 20 during diode operation is reduced, so that recovery loss during the diode operation is reduced.

The p$^+$-type contact layer 24 is provided on the first main surface side of the p-type anode layer 25. The p$^+$-type contact layer 24 may have a concentration of p-type impurities that is identical to or different from a concentration of p-type impurities in the p$^+$-type contact layer 14 in the IGBT region 10. The p$^+$-type contact layer 24 constitutes the first main surface of the semiconductor substrate. The p$^+$-type contact layer 24 has a concentration of p-type impurities, being higher than a concentration of p-type impurities in the p-type anode layer 25. When the p$^+$-type contact layer 24 and the p-type anode layer 25 are not required to be distinguished from each other, they may be collectively referred to as a p-type anode layer.

In the diode region 20, the n$^+$-type cathode layer 26 is provided on the second main surface side of the n-type buffer layer 3. The n$^+$-type cathode layer 26 is provided between the n$^-$-type drift layer 1 and the second main surface. The n$^+$-type cathode layer 26 is a semiconductor layer having, for example, arsenic or phosphorus as n-type impurities, and the n-type impurities have a concentration of $1.0 \times 10^{16}/cm^3$ or more and $1.0 \times 10^{21}/cm^3$ or less. The n$^+$-type cathode layer 26 is provided in a part or all of the diode region 20. The n$^+$-type cathode layer 26 constitutes the second main surface of the semiconductor substrate. Although not illustrated, p-type impurities may be selectively injected into a region provided with the n$^+$-type cathode layer 26 to form a p-type cathode layer in a part of the region provided with the n$^+$-type cathode layer 26.

As illustrated in FIG. 7, the diode region 20 is provided with a plurality of trenches that passes through the p-type anode layer 25 from the first main surface of the semiconductor substrate and reaches the n⁻-type drift layer 1. When the diode trench electrode 21a covered with the diode trench insulating film 21b is provided in each of the trenches, the diode trench gate 21 is formed. The diode trench electrode 21a faces the n⁻-type drift layer 1 with the diode trench insulating film 21b interposed therebetween.

As illustrated in FIG. 7, the barrier metal 5 is provided on the diode trench electrode 21a and the p⁺-type contact layer 24. The barrier metal 5 is in ohmic contact with the diode trench electrode 21a and the p⁺-type contact layer 24, and is electrically connected to the diode trench electrode 21a and the p⁺-type contact layer 24. The barrier metal 5 in the diode region 20 may be identical in structure to the barrier metal 5 in the IGBT region 10.

In the diode region 20, the emitter electrode 6 is provided on the barrier metal 5. The emitter electrode 6 in the diode region 20 is continuously formed with the emitter electrode 6 in the IGBT region 10. The RC-IGBT 100, 101 may be configured such that the diode trench electrode 21a and the p⁺-type contact layer 24 are brought into ohmic contact with the emitter electrode 6 without providing the barrier metal 5 in the diode region 20.

Although in FIG. 7, the interlayer insulating film 4 is not formed on the diode trench electrode 21a of the diode trench gate 21, the interlayer insulating film 4 may be formed on the diode trench electrode 21a of the diode trench gate 21. When the interlayer insulating film 4 is formed on the dummy trench electrode 12a of the dummy trench gate 12, the emitter electrode 6 and the diode trench electrode 21a may be electrically connected in a section other than the section C-C' illustrated in FIG. 7.

The collector electrode 7 is provided on the second main surface side of the n⁺-type cathode layer 26. As with the emitter electrode 6, the collector electrode 7 in the diode region 20 is continuously formed with the collector electrode 7 in the IGBT region 10. The collector electrode 7 is in ohmic contact with the n⁺-type cathode layer 26 and is electrically connected to the n⁺-type cathode layer 26.

Figure 8:
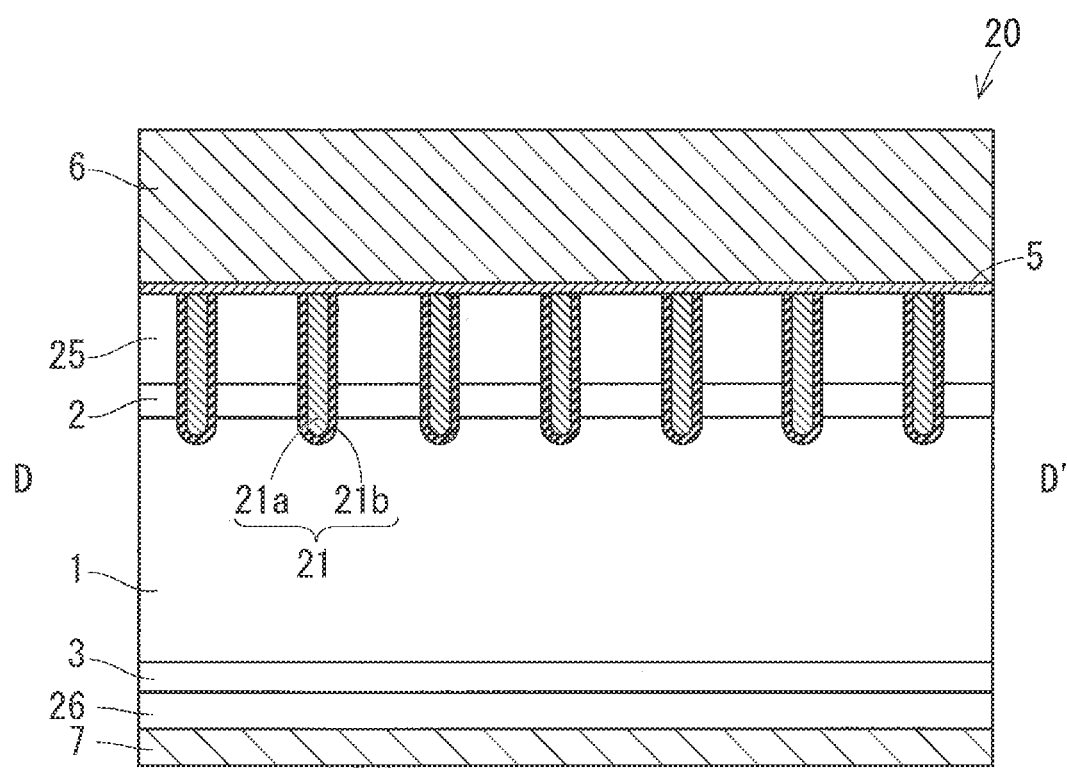
FIG. 8 is a sectional view of the diode region taken along line D-D' of FIG. 6.

FIG. 8 is a sectional view of the diode region 20 taken along line D-D' of FIG. 6. FIG. 8 illustrates a sectional structure that is different from the sectional structure of the diode region 20 taken along line C-C' of FIG. 6 illustrated in FIG. 7 in that the p⁺-type contact layer 24 is not provided between the p-type anode layer 25 and the barrier metal 5, and the p-type anode layer 25 constitutes the first main surface of the semiconductor substrate. That is, the p⁺-type contact layer 24 illustrated in FIG. 7 is selectively provided on the first main surface side of the p-type anode layer 25.

A-6. Boundary Region Between IGBT Region and Diode Region

Figure 9:
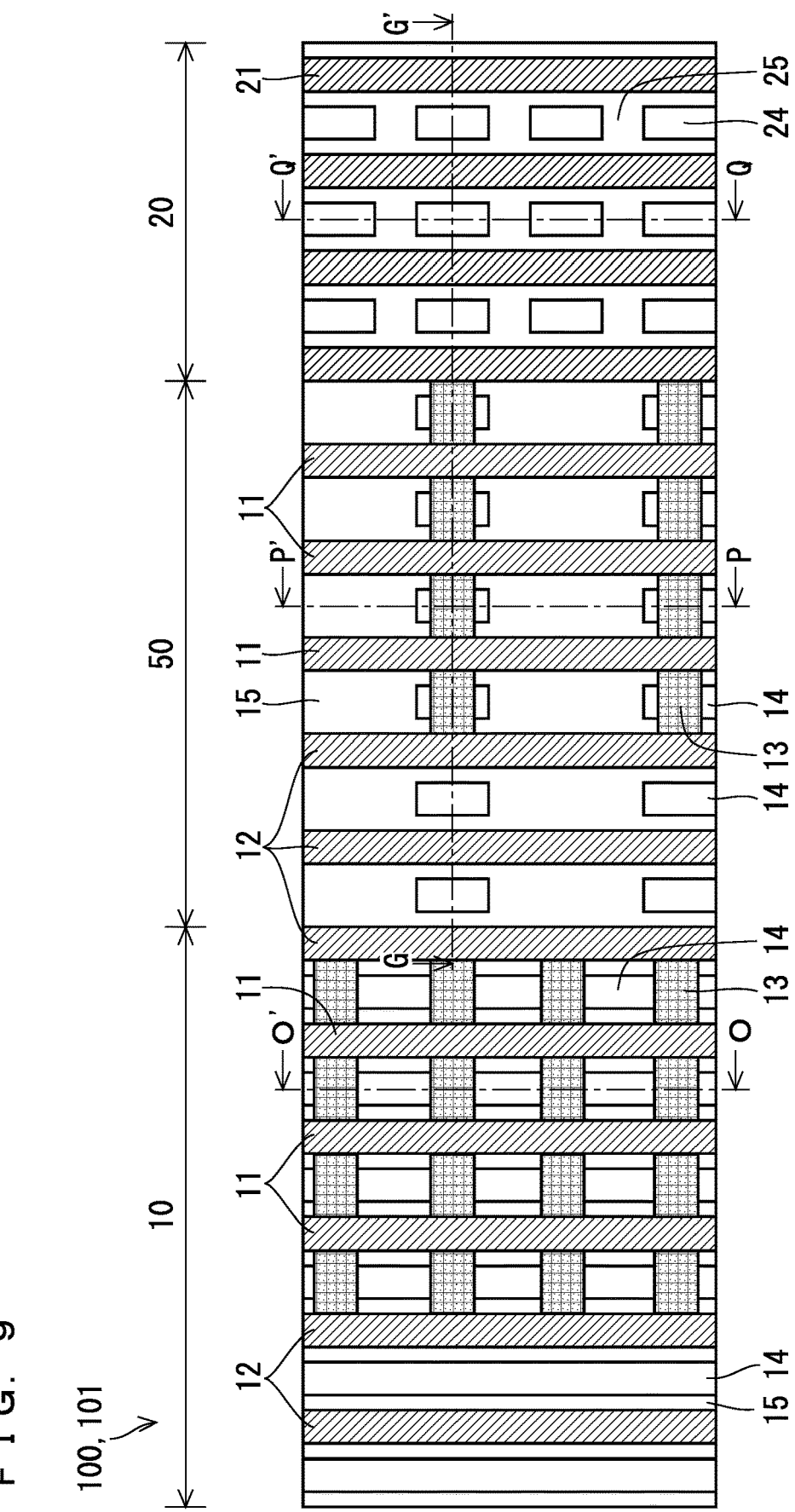
FIG. 9 is a plan view of an IGBT region, a boundary region, and a diode region in an RC-IGBT of a first preferred embodiment.
Figure 10:
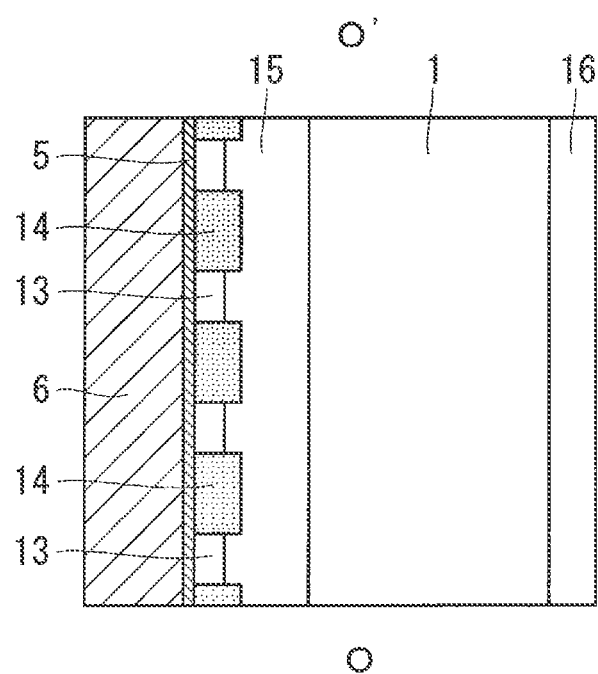
FIG. 10 is a sectional view of the IGBT region taken along line O-O' of FIG. 9.
Figure 11:
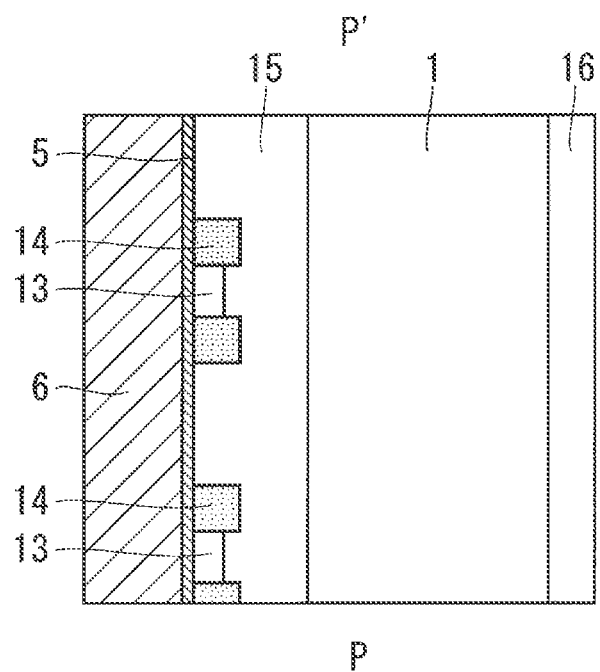
FIG. 11 is a sectional view of the boundary region of the first preferred embodiment taken along line P-P' of FIG. 9.
Figure 12:
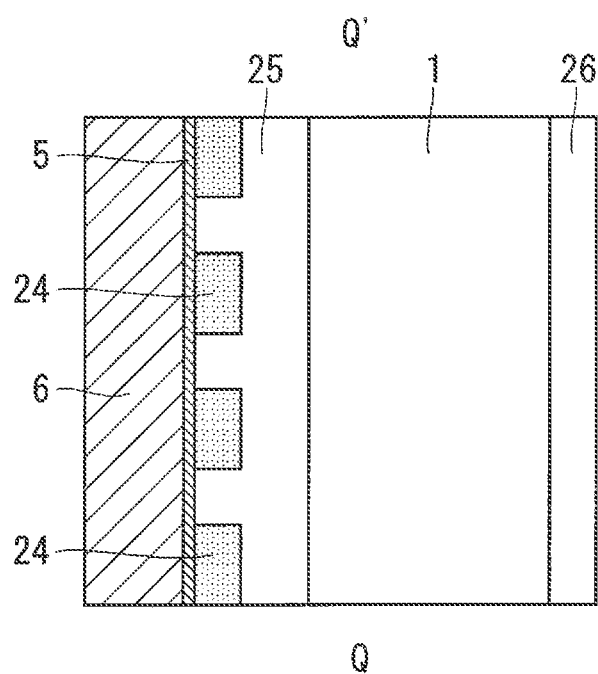
FIG. 12 is a sectional view of the diode region taken along line Q-Q' of FIG. 9.

FIG. 9 is an enlarged plan view of a region of the RC-IGBT 101, 102, including the IGBT region 10, the boundary region 50, and the diode region 20. FIG. 9 illustrates line G-G' that coincides with line G-G' in FIG. 1 or 2. FIG. 10 is a sectional view of the IGBT region 10 taken along line O-O' of FIG. 9. FIG. 11 is a sectional view of the boundary region 50 taken along line P-P' of FIG. 9. FIG. 12 is a sectional view of the diode region 20 taken along line Q-Q' of FIG. 9.

FIG. 9 illustrates a structure of the IGBT region 10 and the diode region 20, the structure being as illustrated in FIGS. 3 and 6. The boundary region 50 existing between the IGBT region 10 and the diode region 20 has a basic structure that is identical to that of the IGBT region 10. However, the boundary region 50 has an occupancy rate of the n⁺-type source layer 13 per unit area in plan view (hereinafter referred to as an "occupancy rate of the n⁺-type source layer 13"), the occupancy rate being smaller than an occupancy rate of the n⁺-type source layer 13 in the IGBT region 10.

The p⁺-type contact layer 14 is provided adjacent to the if-type source layer 13 to secure latch-up resistance of the IGBT. The boundary region 50 has a smaller occupancy rate of the n⁺-type source layer 13 than the IGBT region 10, and thus similarly, an occupancy rate of the p⁺-type contact layer 14 per unit area in the boundary region 50 in plan view (hereinafter, referred to as an "occupancy rate of the p⁺-type contact layer 14") can also be reduced. According to the structure of RC-IGBT 100, 101 of the present preferred embodiment, when the occupancy rate of the p⁺-type contact layer 14 having high hole injection efficiency is reduced in the boundary region 50, the hole injection efficiency in the boundary region 50 is reduced. Thus, an inflow of holes from the boundary region 50 to the diode region 20 is reduced during forward operation of the diode.

The occupancy rate of the p⁺-type contact layer 14 in the boundary region 50 may be smaller than an occupancy rate of the p⁺-type contact layer 24 in the diode region 20. In other words, the occupancy rate of the p⁺-type contact layer 24 in the diode region 20 may be larger than the occupancy rate of the p⁺-type contact layer 14 in the boundary region 50. This reduces on-voltage in the diode region 20 during forward operation, and thus a current easily flows. Thus, a flow of a current into the boundary region 50 is relatively reduced, so that a recovery current generated in the boundary region 50 can be reduced. This enables recovery loss to be reduced.

Although the p⁺-type contact layer 14 disposed between the dummy trench gates 12 in the boundary region 50 may be disposed throughout the entire area between the dummy trench gates 12 as in the IGBT region 10, the p⁺-type contact layer 14 is preferably reduced in placement area as illustrated in FIG. 9, like the p⁺-type contact layer 14 provided adjacent to the n⁺-type source layer 13 in the boundary region 50. The p⁺-type contact layer 14 may not be disposed between the dummy trench gates 12 in the boundary region 50.

As illustrated in FIG. 11, in the boundary region 50, the emitter electrode 6 is in contact with the semiconductor substrate with the barrier metal 5 interposed therebetween. The emitter electrode 6 is in contact with not only the n⁺-type source layer 13 and the p⁺-type contact layer 14 but also the p-type base layer 15 with the barrier metal 5 interposed therebetween. During forward operation in the diode region 20, some of electrons injected from the n⁺-type cathode layer 26 on the back surface side flow to the emitter electrode 6 in the boundary region 50. At this time, when the electrons flow through the p⁺-type contact layer 14 disposed to obtain good contact resistance using ohmic contact with the barrier metal 5, many holes are injected into the n⁻-type drift layer 1 due to the high hole injection efficiency of the p⁺-type contact layer 14, and thus causing an increase in recovery loss.

The RC-IGBT 100, 101 is configured such that when an occupancy rate of each of the n⁺-type source layer 13 and the p⁺-type contact layer 14 in the boundary region 50 is reduced, an exposed area of the p-type base layer 15 to the first main surface of the semiconductor substrate is increased. Then, when an exposed portion of the p-type base layer 15 comes into contact with the emitter electrode 6 with the barrier metal 5 interposed therebetween in a contact hole of the interlayer insulating film 4, electrons are also discharged from the exposed portion toward the emitter electrode 6. The p-type base layer 15 has a lower concentration of p-type impurities and a lower hole injection efficiency than the p$^+$-type contact layer 14, so that the recovery loss is reduced, Although increase in area of a region where the p-type base layer 15 is in contact with the emitter electrode 6 with the barrier metal 5 interposed therebetween enables reducing the recovery loss more, the region is designed in accordance with required loss.

Figure 13:
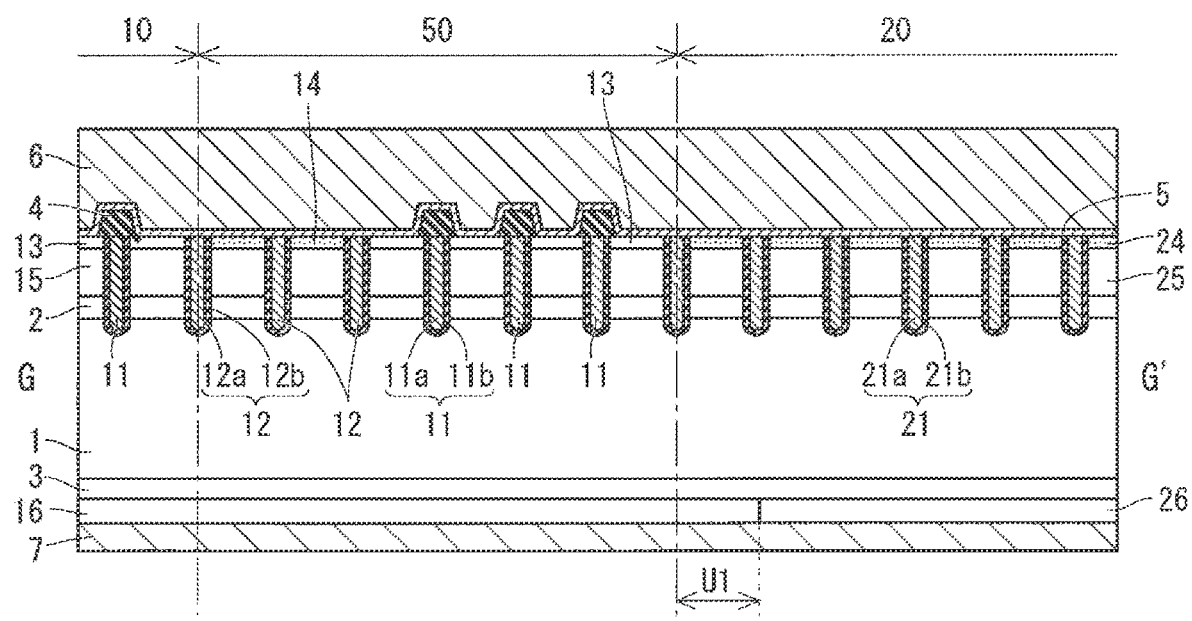
FIG. 13 is a sectional view of the IGBT region, the boundary region, and the diode region taken along line G-G' of FIG. 9.

FIG. 13 is a sectional view of the RC-IGBT 100, 101 taken along line G-G' of FIG. 9. As illustrated in FIG. 13, the p-type collector layer 16 provided on a second main surface side in each of the IGBT region 10 and the boundary region 50 is provided protruding from a boundary between the boundary region 50 and the diode region 20 toward the diode region 20 by a distance U1. When the p-type collector layer 16 is provided protruding from the diode region 20 as described above, a distance between the n$^+$-type cathode layer 26 in the diode region 20 and the active trench gate 11 can be increased. Thus, when the diode region 20 operates as a freewheeling diode and gate drive voltage is applied to the gate trench electrode 11a, a current can be prevented from flowing to the n$^+$-type cathode layer 26 from a channel formed adjacent to the active trench gate 11 in the IGBT region 10. The distance U1 is, for example, 100 µm. The distance U1 may be smaller than 100 µm, or may be zero, depending on application of RC-IGBT 100, 101.

A-7. General Structure of Terminal Region

Figure 15:
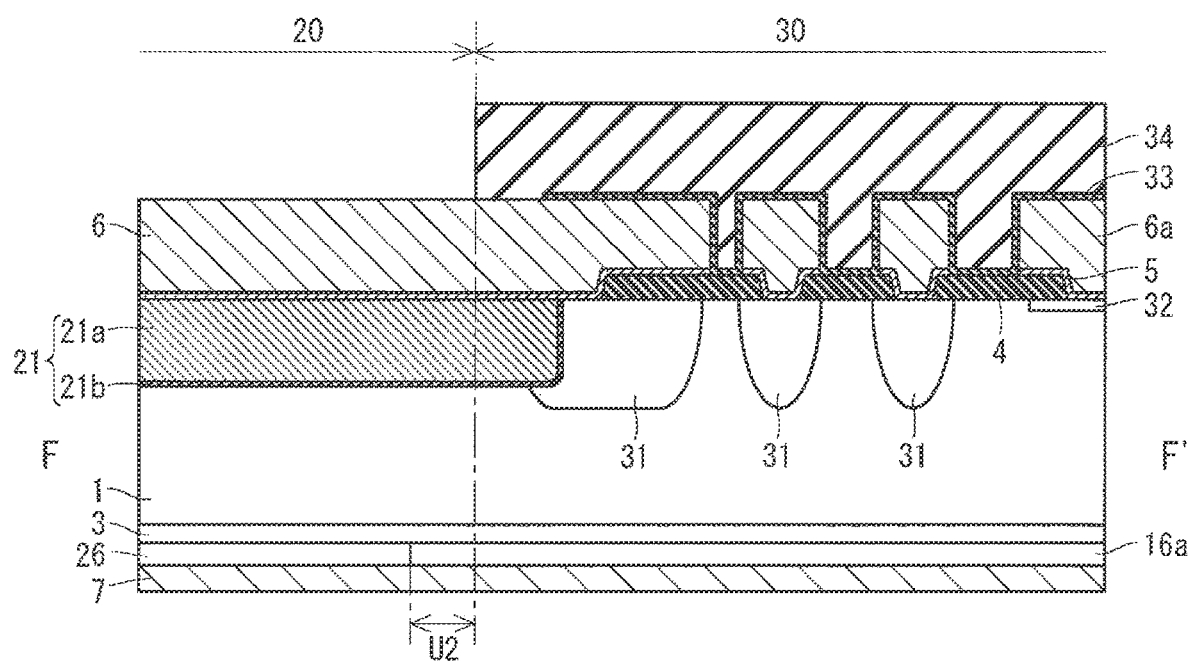
FIG. 15 is a sectional view of the diode region and the terminal region taken along line F-F' of FIG. 1 or 2.

Next, a structure of the terminal region 30 of the RC-IGBT 100, 101 will be described. FIG. 14 is a sectional view of the RC-IGBT 100, 101 taken along line E-E' of FIG. 1 or 2, and illustrates a structure from the IGBT region 10 to the terminal region 30. FIG. 15 is a sectional view of the RC-IGBT 100, 101 taken along line F-F' of FIG. 1 or 2, and illustrates a structure from the diode region 20 to the terminal region 30.

As illustrated in FIGS. 14 and 15, the terminal region 30 has the n$^-$-type drift layer 1 between the first main surface and the second main surface of the semiconductor substrate. The first main surface and the second main surface in the terminal region 30 are respectively flush with the first main surface and the second main surface in each of the IGBT region 10 and the diode region 20. The n$^-$-type drift layer 1 in the terminal region 30 is identical in structure to the n$^-$-type drift layer 1 in each of the IGBT region 10 and the diode region 20, and is continuously and integrally formed with the n$^-$-type drift layer 1 in each of them.

On a first main surface side of the n$^-$-type drift layer 1, i.e., between the first main surface of the semiconductor substrate and the n$^-$-type drift layer 1, a p-type terminal well layer 31 is provided. The p-type terminal well layer 31 is a semiconductor layer having, for example, boron or aluminum as p-type impurities, and the p-type impurities have a concentration of $1.0 \times 10^{14}/cm^3$ or more and $1.0 \times 10^{19}/cm^3$ or less. The p-type terminal well layer 31 is provided surrounding the cell region including the IGBT region 10 and the diode region 20. The p-type terminal well layer 31 is one of a plurality of p-type terminal well layers 31 each in a ring shape, and the number thereof is appropriately determined suitable for withstand voltage design of the RC-IGBT 100, 101. The p-type terminal well layer 31 is provided on its outer edge side with an n$^+$-type channel stopper layer 32 surrounding the p-type terminal well layer 31.

Between the n$^-$-type drift layer 1 and the second main surface of the semiconductor substrate, the p-type terminal collector layer 16a is provided. The p-type terminal collector layer 16a is continuously and integrally formed with the p-type collector layer 16 provided in the cell region. Thus, a p-type collector layer including the p-type terminal collector layer 16a may be referred to as the p-type collector layer 16. In a structure in which the diode region 20 is provided adjacent to the terminal region 30 as in the RC-IGBT 100 illustrated in FIG. 1, the p-type terminal collector layer 16a is provided protruding into the diode region 20 by only a distance U2 as illustrated in FIG. 15. When the p-type termination collector layer 16a protrudes into the diode region 20 as described above, a distance between the n$^+$-type cathode layer 26 and the p-type terminal well layer 31 in the diode region 20 increases, and thus the p-type terminal well layer 31 is prevented from operating as an anode of a diode. The distance U2 is, for example, 100 µm.

The collector electrode 7 is provided on the second main surface of the semiconductor substrate. The collector electrode 7 is continuously and integrally formed from the cell region including the IGBT region 10 and the diode region 20 to the terminal region 30. In contrast, the semiconductor substrate in the terminal region 30 is provided on the first main surface with the emitter electrode 6 extending continuously from the cell region, and a terminal electrode 6a separated from the emitter electrode 6.

The emitter electrode 6 and the terminal electrode 6a are electrically connected to each other using a semi-insulating film 33. The semi-insulating film 33 is, for example, a semi-insulating silicon nitride (sinSiN). The terminal electrode 6a, the p-type terminal well layer 31, and the n+-type channel stopper layer 32 are electrically connected using a contact hole formed in the interlayer insulating film 4 provided on the first main surface of the terminal region 30. The terminal region 30 is provided with a terminal protective film 34 covering the emitter electrode 6, the terminal electrode 6a, and the semi-insulating film 33. The terminal protective film 34 is, for example, made of polyimide.

A-8. Effect

The boundary region 50 has the same structure as the IGBT region 10 (the p-type collector layer 16, the n$^-$-type drift layer 1, the p-type base layer 15, the n$^+$-type source layer 13, the p$^+$-type contact layer 14, p-type base layer 15, barrier metal 5, and the emitter electrode 6). The boundary region 50 has an occupancy rate of the n$^+$-type source layer 13 and the p$^+$-type contact layer 14 per unit area in plan view (hereinafter referred to as an "occupancy rate"), the occupancy rate being smaller than an occupancy rate of the n$^+$-type source layer 13 and the p$^+$-type contact layer 14 in the IGBT region 10. Thus, although the boundary region 50 is inferior to the IGBT region 10 in energizing capacity, it operates as an IGBT region, and thus the RC-IGBT 100, 101 can secure sufficient energizing capacity. The boundary region 50 also enables reducing holes flowing into the diode region 20 from the IGBT region 10 during forward operation of the diode region 20, so that the recovery loss can be reduced.

The boundary region 50 has an occupancy rate of the p$^+$-type contact layer 14, the occupancy rate being smaller than an occupancy rate of the p$^+$-type contact layer 14 in the diode region 20. This reduces on-voltage in the diode region 20 during forward operation, and thus a current easily flows. Thus, a flow of a current into the boundary region 50 is relatively reduced, so that a recovery current generated in the boundary region 50 can be reduced. This enables recovery loss to be reduced.

In the boundary region 50, the emitter electrode 6 is in contact with not only the $n^+$-type source layer 13 and the $p^+$-type contact layer 14 but also the p-type base layer 15 with the barrier metal 5 interposed therebetween. During forward operation in the diode region 20, electrons are injected from the $n^+$-type cathode layer 26 on the back surface side, and some of the electrons flow to the emitter electrode 6 in the boundary region 50. At this time, when the electrons flow through the $p^+$-type contact layer 14 disposed to obtain good contact resistance using ohmic contact with the barrier metal 5, many holes are injected into the $n^-$-type drift layer 1 due to the high hole injection efficiency of the $p^+$-type type contact layer 14, and thus causing an increase in recovery loss. The RC-IGBT 100, 101 is configured such that when each of the $n^+$-type source layer 13 and the $p^+$-type contact layer 14 in the boundary region 50 is reduced in area, an exposed area of the p-type base layer 15 to the first main surface of the semiconductor substrate is increased. Then, when an exposed portion of the p-type base layer 15 actively comes into contact with the emitter electrode 6 with the barrier metal 5 interposed therebetween, electrons are also discharged from the exposed portion toward the emitter electrode 6. The p-type base layer 15 has a lower concentration of p-type impurities and a lower hole injection efficiency than the $p^+$-type contact layer 14, so that the recovery loss can be reduced.

The p-type anode layer 25 in the diode region 20 may have a concentration of p-type impurities, being lower than a concentration of p-type impurities in the p-type base layer 15 in each of the IGBT region 10 and the boundary region 50. When the p-type anode layer 25 in the diode region 20 is reduced in concentration of p-type impurities, the hole injection efficiency can be further reduced, and thus the recovery loss can be reduced.

The boundary region 50 may have a width larger than a thickness of the semiconductor substrate. When the width of the boundary region 50 is increased to be larger than the thickness of the semiconductor substrate, the hole injection from the IGBT region 10 to the diode region 20 can be reliably reduced, and thus the recovery loss can be reduced.

B. Second Preferred Embodiment

B-1. Structure

RC-IGBT 102 of a second preferred embodiment is an RC-IGBT of a stripe type or an island type. A plan view of the RC-IGBT 102 is similar to the plan view of the RC-IGBT 100, 101 of the first preferred embodiment illustrated in FIG. 1 or 2, so that FIG. 1 or 2 is used as the plan view of the RC-IGBT 102 in the present preferred embodiment.

Figure 16:
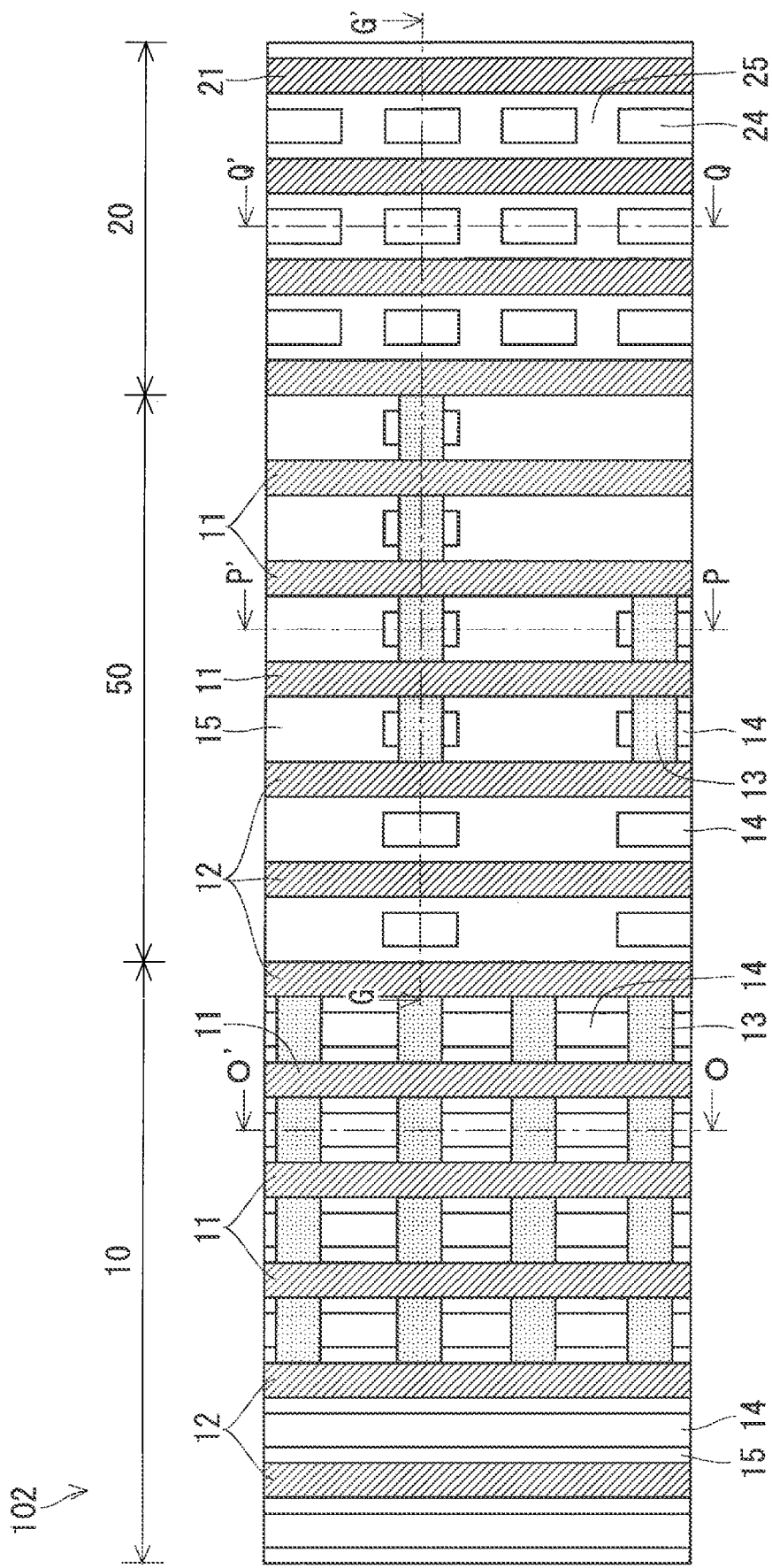
FIG. 16 is a plan view of an IGBT region, a boundary region, and a diode region in an RC-IGBT of a second preferred embodiment.

FIG. 16 is an enlarged plan view of a region of the RC-IGBT 102, including an IGBT region 10, a boundary region 50, and a diode region 20. FIG. 16 illustrates line G-G' that coincides with line G-G' in FIG. 1 or 2. The IGBT region 10 has a sectional structure that is taken along line O-O' in FIG. 16 and is as illustrated in FIG. 10. The boundary region 50 has a sectional structure that is taken along line P-P' in FIG. 16 and is as illustrated in FIG. 11. The diode region 20 has a sectional structure that is taken along line Q-Q' in FIG. 16 and is as illustrated in FIG. 12.

As illustrated in FIG. 16, in the plan view of the RC-IGBT 102, an occupancy rate of an $n^+$-type source layer 13 formed between active trench gates 11 in the boundary region 50 gradually decreases from an IGBT region 10 side toward the diode region 20.

B-2. Effect

The RC-IGBT 102 of the second preferred embodiment is configured such that the occupancy rate of the $n^+$-type source layer 13 per unit area in the boundary region 50 gradually decreases from the IGBT region 10 side toward the diode region 20. This causes hole injection efficiency to be reduced particularly in a region close to the diode region 20 in the boundary region 50. Thus, injection of holes from the boundary region 50 to the diode region 20 is further reduced, and thus recovery loss is further reduced.

C. Third Preferred Embodiment

C-1. Structure

An RC-IGBT 103 of a third preferred embodiment is an RC-IGBT of a stripe type or an island type. A plan view of the RC-IGBT 103 is similar to the plan view of the RC-IGBT 100, 101 of the first preferred embodiment illustrated in FIG. 1 or 2, so that FIG. 1 or 2 is used as the plan view of the RC-IGBT 103 in the present preferred embodiment.

Figure 17:
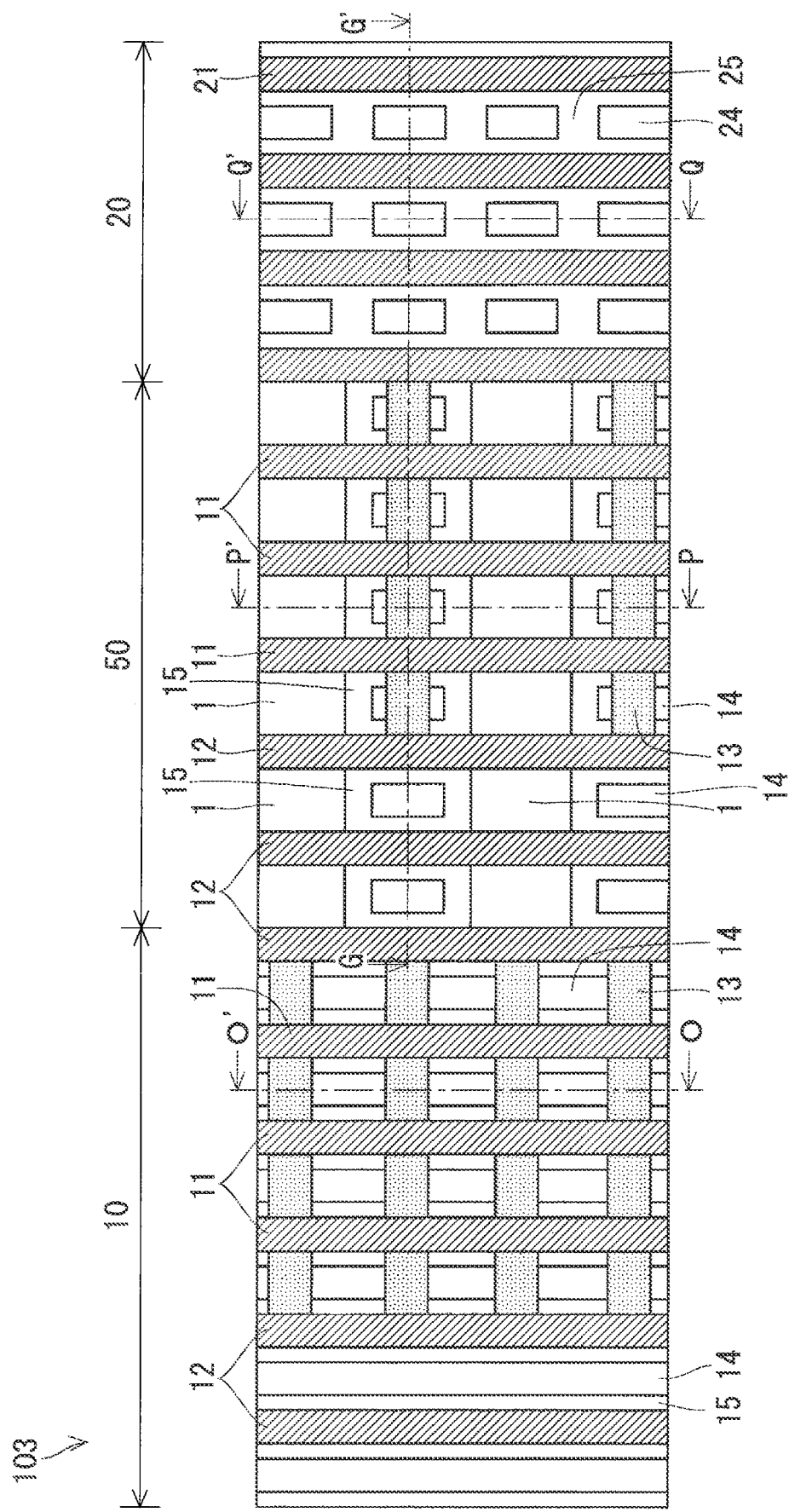
FIG. 17 is a plan view of an IGBT region, a boundary region, and a diode region in an RC-IGBT of a third preferred embodiment.

FIG. 17 is an enlarged plan view of a region of the RC-IGBT 103, including an IGBT region 10, a boundary region 50, and a diode region 20. FIG. 17 illustrates line G-G' that coincides with line G-G' in FIG. 1 or 2. The IGBT region 10 has a sectional structure that is taken along line O-O' in FIG. 17 and is as illustrated in FIG. 10. The diode region 20 has a sectional structure that is taken along line Q-Q' in FIG. 17 and is as illustrated in FIG. 12.

Figure 18:
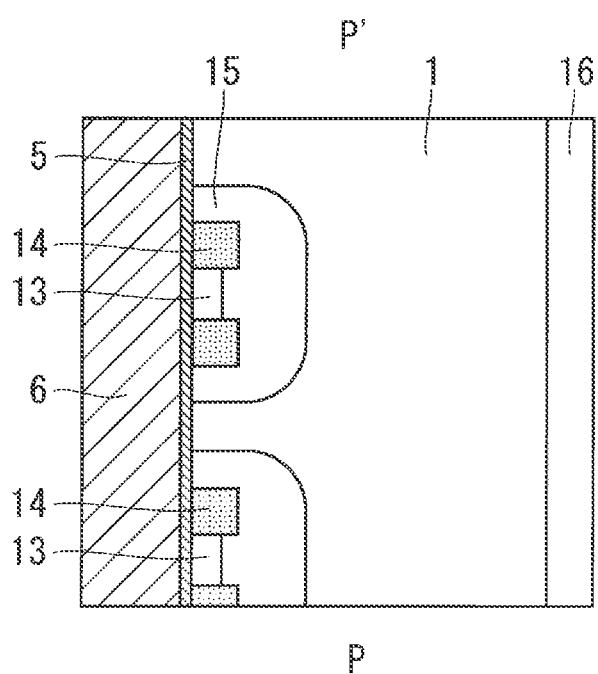
FIG. 18 is a sectional view of the boundary region of the third preferred embodiment taken along line P-P' of FIG. 17.

FIG. 18 is a sectional view of the boundary region 50 taken along line P-P' of FIG. 17. As illustrated in FIG. 18, a p-type base layer 15 in the boundary region 50 of RC-IGBT 103 is formed surrounding a $p^+$-type contact layer 14, but is not formed throughout the boundary region 50 and is formed only in some regions. In other words, the boundary region 50 includes a region on a first main surface where an $n^+$-type source layer 13 or the $p^+$-type contact layer 14 is not formed, at least a part of the region being provided without the p-type base layer 15. As illustrated in FIG. 18, an $n^-$-type drift layer 1 may be exposed in the region where the p-type base layer 15 is not formed, and may or may not be in contact with an emitter electrode 6 with a barrier metal 5 interposed therebetween.

C-2. Effect

The RC-IGBT 103 of the third preferred embodiment is configured such that the boundary region 50 includes the region on the first main surface where the $n^+$-type source layer 13 or the $p^+$-type contact layer 14 is not formed, at least a part of the region being provided without the p-type base layer 15. This causes hole injection efficiency from the boundary region 50 to the diode region 20 to be further reduced, and thus recovery loss is further reduced.

D. Fourth Preferred Embodiment

D-1. Structure

An RC-IGBT 104 of a fourth preferred embodiment is an RC-IGBT of a stripe type or an island type. A plan view of the RC-IGBT 104 is similar to the plan view of the RC- IGBT 100, 101 of the first preferred embodiment illustrated in FIG. 1 or 2, so that FIG. 1 or 2 is used as the plan view of the RC-IGBT 104 in the present preferred embodiment.

Figure 19:
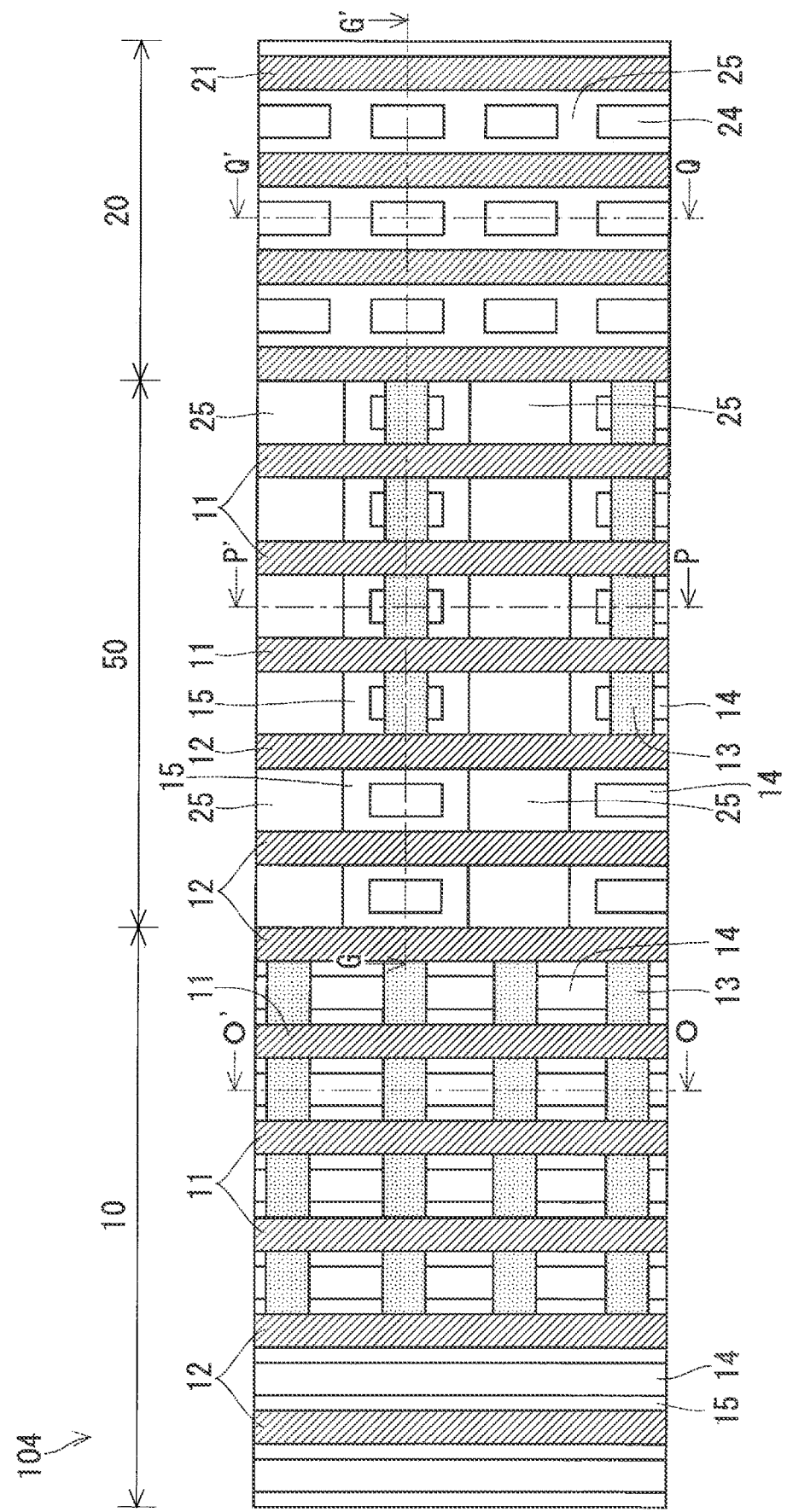
FIG. 19 is a plan view of an IGBT region, a boundary region, and a diode region in an RC-IGBT of a fourth preferred embodiment.

FIG. 19 is an enlarged plan view of a region of the RC-IGBT 104, including an IGBT region 10, a boundary region 50, and a diode region 20. FIG. 19 illustrates line G-G' that coincides with line G-G' in FIG. 1 or 2, The IGBT region 10 has a sectional structure that is taken along line O-O' in FIG. 19 and is as illustrated in FIG. 10. The diode region 20 has a sectional structure that is taken along line Q-Q' in FIG. 19 and is as illustrated in FIG. 12.

Figure 20:
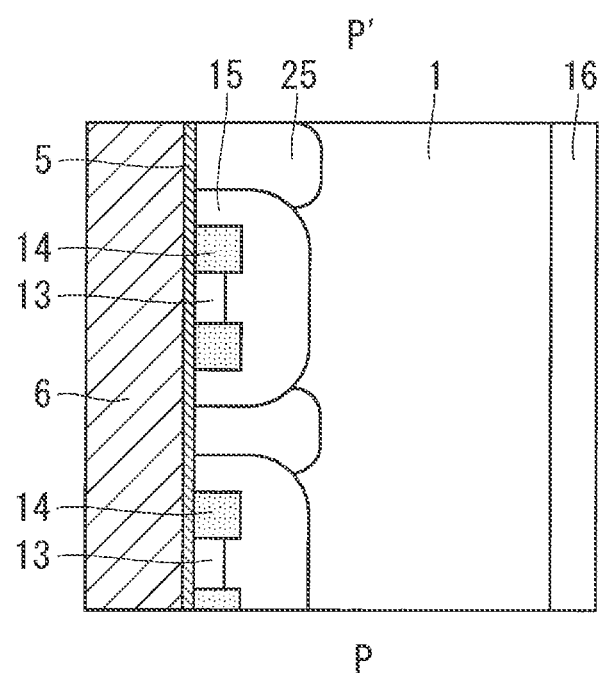
FIG. 20 is a sectional view of the boundary region of the fourth preferred embodiment taken along line P-P' of FIG. 19.

FIG. 20 is a sectional view of the boundary region 50 taken along line P-P' of FIG. 19. As illustrated in FIG. 20, a p-type base layer 15 in the boundary region 50 of RC-IGBT 104 is formed surrounding a p$^+$-type contact layer 14, but is not formed throughout the boundary region 50 and is formed only in some regions. A p-type anode layer 25 is formed on a region of a first main surface of a semiconductor substrate where the p-type base layer 15 is not fooled, and the p-type anode layer 25 is in contact with an emitter electrode 6 with a barrier metal 5 interposed therebetween. The RC-IGBT 104 is configured such that the p-type anode layer 25 has a concentration of p-type impurities, being lower than a concentration of p-type impurities in the p-type base layer 15 in the IGBT region 10.

D-2. Effect

The RC-IGBT 104 of the fourth preferred embodiment is configured such that the p-type anode layer 25 is formed on the first main surface of the semiconductor substrate where the p-type base layer 15 of the boundary region. This enables withstand voltage performance in the boundary region 50 to be maintained high. When the concentration of p-type impurities of the p-type anode layer 25 is reduced to lower than the concentration of p-type impurities in the p-type base layer 15, the hole injection efficiency from the boundary region 50 to the diode region 20 can be further reduced, and thus recovery loss can be further reduced.

E. Fifth Preferred Embodiment

E-1. Structure

An RC-IGBT 105 of a fifth preferred embodiment is an RC-IGBT of a stripe type or an island type. A plan view of the RC-IGBT 105 is similar to the plan view of the RC-IGBT 100, 101 of the first preferred embodiment illustrated in FIG. 1 or 2, so that FIG. 1 or 2 is used as the plan view of the RC-IGBT 105 in the present preferred embodiment.

Figure 21:
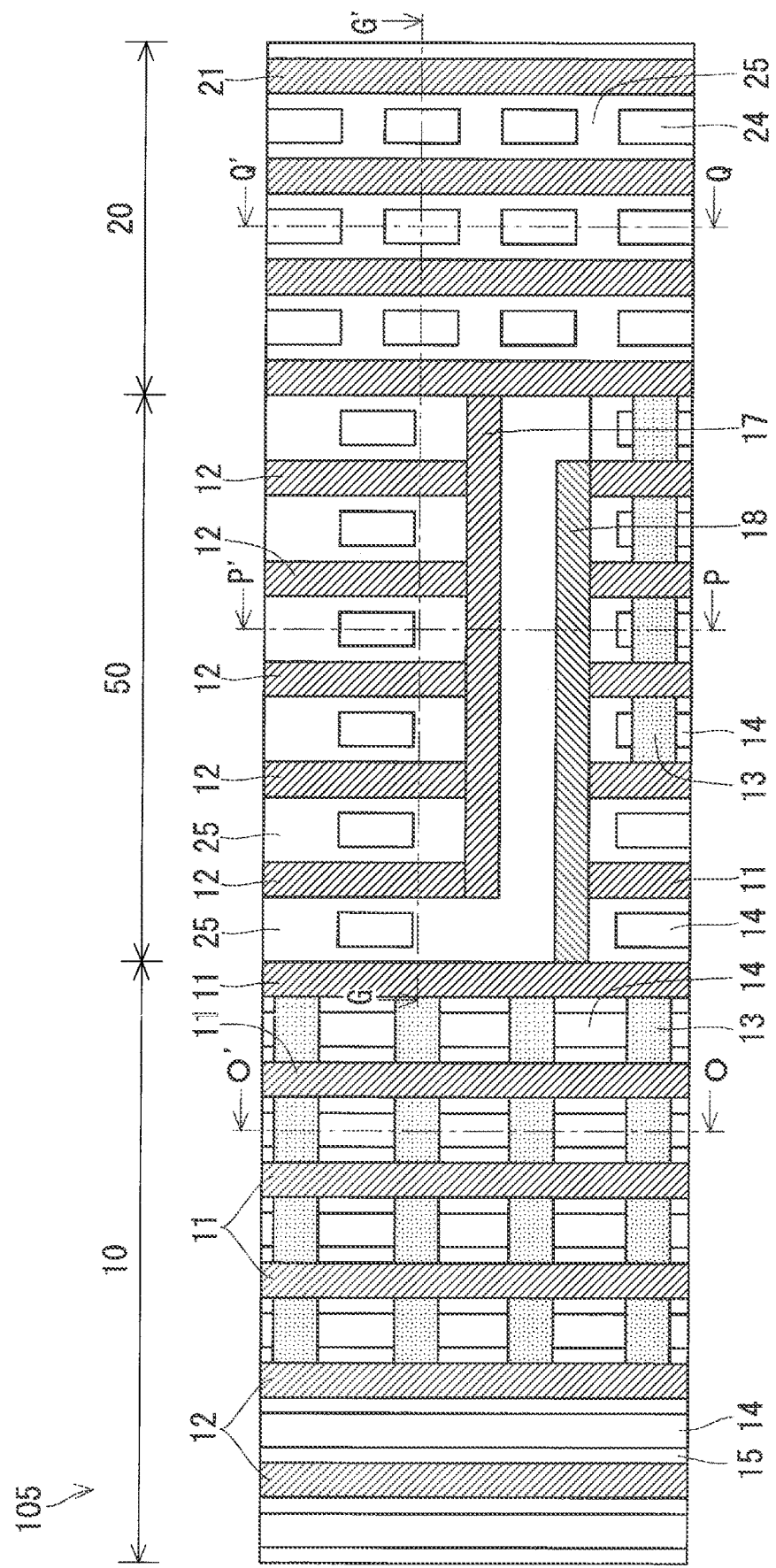
FIG. 21 is a plan view of an IGBT region, a boundary region, and a diode region in an RC-IGBT of a fifth preferred embodiment.

FIG. 21 is an enlarged plan view of a region of the RC-IGBT 105, including an IGBT region 10, a boundary region 50, and a diode region 20. FIG. 21 illustrates line G-G' that coincides with line G-G' in FIG. 1 or 2. The IGBT region 10 has a sectional structure that is taken along line O-O' in FIG. 21 and is as illustrated in FIG. 10. The diode region 20 has a sectional structure that is taken along line Q-Q' in FIG. 21 and is as illustrated in FIG. 12.

Figure 22:
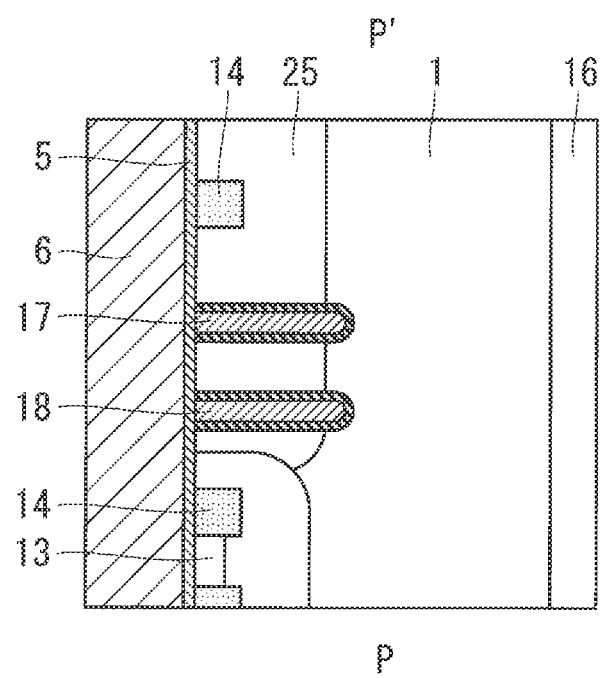
FIG. 22 is a sectional view of the boundary region of the fifth preferred embodiment taken along line P-P' of FIG. 21.

FIG. 22 is a sectional view of the boundary region 50 taken along line P-P' of FIG. 21. As illustrated in FIG. 21, the boundary region 50 of the RC-IGBT 105 has an upper half region in FIG. 21, and the upper half region is not formed with an n$^+$-type source layer 13 and does not perform IGBT operation. This region is referred to as an IGBT non-operating region. The boundary region 50 of the RC-IGBT 105 has a lower half region in FIG. 21, and the lower half region is formed with the n$^+$-type source layer 13 and performs the IGBT operation. This region is referred to as an IGBT operating region. In other words, the boundary region 50 is divided into the IGBT operating region and the IGBT non-operating region.

Then, a trench gate extending in a vertical direction in FIG. 21 is split by the IGBT operating region and the IGBT non-operating region. The IGBT non-operating region is formed with a trench that is connected to a diode trench gate 21 in the diode region 20 by a trench gate 17 that is a second dummy trench gate formed in a horizontal direction in FIG. 21, the trench serving as a dummy trench gate 12. In other words, the boundary region 50 of the RC-IGBT 105 includes the IGBT non-operating region provided with the trench gate 17 as the second dummy trench gate that is formed in at least a part of a region on a first main surface, the region being provided without a p-type base layer 15, and that extends from the first main surface to reach an n$^-$-type drift layer 1. The second dummy trench gate 17 then is in contact with the diode trench gate 21 in the diode region 20 and at least some of trench gates disposed in the IGBT non-operating region.

The trench gate formed in the IGBT non-operating region is connected to an active trench gate 11 in the IGBT region 10 by a trench gate 18 formed in the horizontal direction in FIG. 21, and functions as the active trench gate 11.

E-2. Effect

The RC-IGBT 105 of the fifth embodiment is configured such that the boundary region 50 is divided into the IGBT operating region in which the n$^+$-type source layer 13 is disposed and the IGBT operation is performed, and the IGBT non-operating region in which the n$^+$-type source layer 13 is not disposed and the IGBT operation is not performed, and further includes the trench gate 17 as the second dummy trench gate that is formed in at least a part of a region on a first main surface, the region being provided without a p-type base layer 15, and that extends from the first main surface to reach an n$^-$-type drift layer 1, in the IGBT non-operating region, the trench gate 17 being in contact with the diode trench gate 21 being a first dummy trench gate in the diode region 20, and at least some of trench gates disposed in the IGBT non-operating region. This causes the trench gate in the IGBT non-operating region in the boundary region 50 to serve as a dummy trench gate, so that recovery loss can be reduced while an increase in gate capacitance is reduced in the boundary region 50.

F. Sixth Preferred Embodiment

F-1. Structure

An RC-IGBT 106 of a sixth preferred embodiment is an RC-IGBT of a stripe type or an island type. The RC-IGBT 106 differs from the RC-IGBT 101, 102 of the first preferred embodiment only in placement of a p$^+$-type contact layer 24 in a diode region 20. A plan view of the RC-IGBT 106 is similar to the plan view of the RC-IGBT 100, 101 of the first preferred embodiment illustrated in FIG. 1 or 2, so that FIG. 1 or 2 is used as the plan view of the RC-IGBT 106 in the present preferred embodiment.

Figure 23:
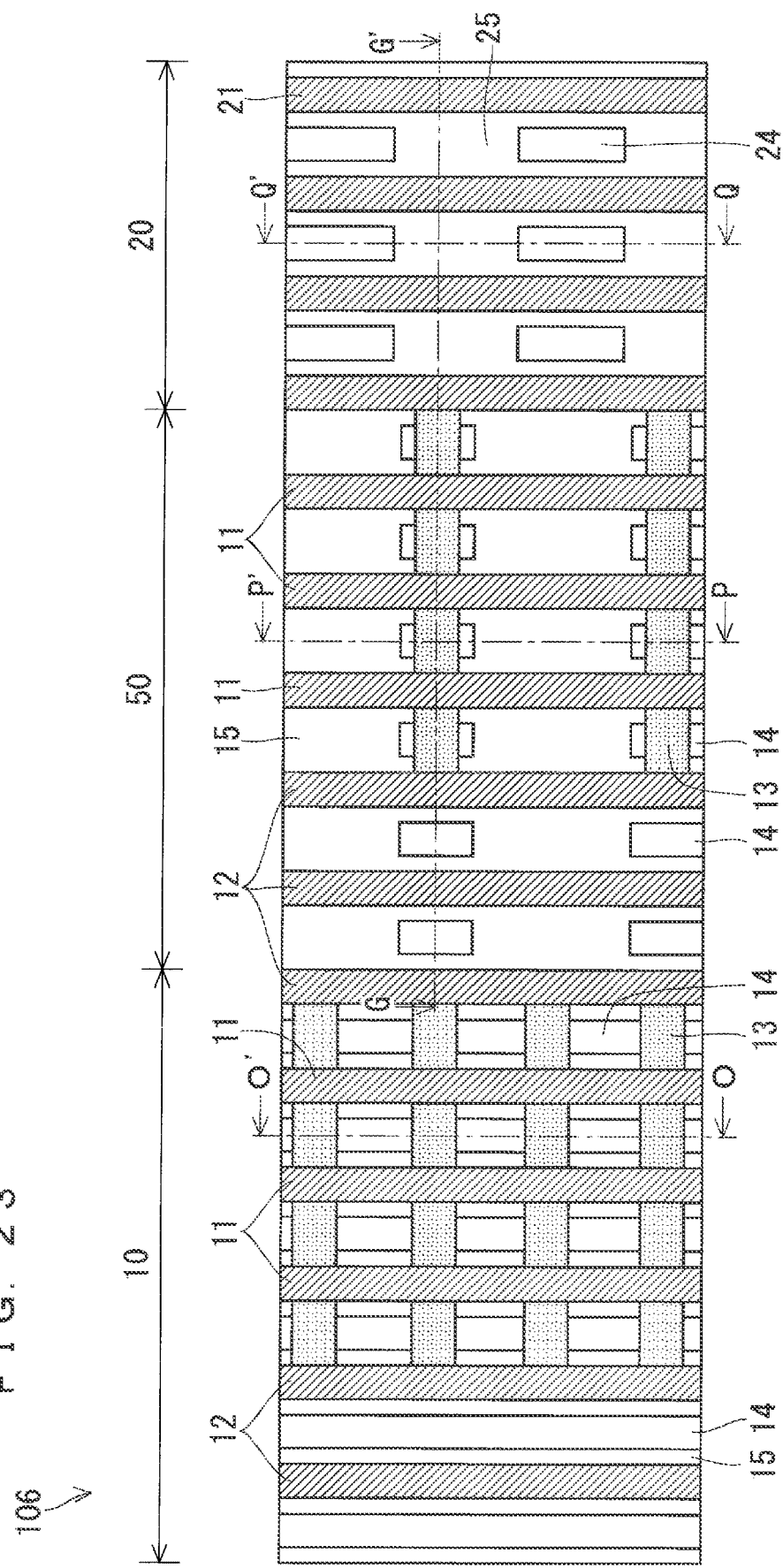
FIG. 23 is a plan view of an IGBT region, a boundary region, and a diode region in an RC-IGBT of a sixth preferred embodiment.

FIG. 23 is an enlarged plan view of a region of the RC-IGBT 106, including an IGBT region 10, a boundary region 50, and a diode region 20. FIG. 23 illustrates line G-G' that coincides with line G-G' in FIG. 1 or 2. The IGBT region 10 has a sectional structure that is taken along line O-O' in FIG. 23 and is as illustrated in FIG. 10, The boundary region 50 has a sectional structure that is taken along line P-P' in FIG. 23 and is as illustrated in FIG. 11.

FIG. 24 is a sectional view of the diode region 20 taken along line Q-Q' of FIG. 23. As illustrated in FIG. 23, the $p^+$-type contact layer 24 in the diode region 20 is prevented from being disposed just beside an $n^+$-type source layer 13 in the boundary region 50. Here, the term, "just beside the $n^+$-type source layer 13", means that a vertical position in FIG. 23 is identical to that of the $n^+$-type source layer 13. In other words, the p+-type contact layer 24 in the diode region 20 is disposed avoiding a portion in the diode region 20, the portion being on a line along a second direction orthogonal to an extension direction of an active trench gate 11, the line extending from a placement region of the $n^+$-type source layer 13 in the boundary region 50.

F-2. Effect

The RC-IGBT 106 of the sixth preferred embodiment is configured such that the $p^+$-type contact layer 24 in the diode region 20 is disposed avoiding the portion in the diode region 20, the portion being on the line along the second direction orthogonal to the extension direction of the active trench gate 11, the line extending from the placement region of the $n^+$-type source layer 13 in the boundary region 50. The $p^+$-type contact layer 24 provided adjacent to the $n^+$-type source layer 13 has high hole injection efficiency, so that the above placement enables reducing recovery loss by reducing a place with high hole density.

Each of the preferred embodiments may be freely combined, or each of the preferred embodiments may be appropriately modified or eliminated.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate including a drift layer of a first conductivity type;
   the semiconductor device including an IGBT region and a diode region that are disposed with a boundary region interposed between the IGBT region and the diode region in a first direction in plan view;
   the semiconductor substrate having a first main surface, and a second main surface facing the first main surface;
   the IGBT region and the boundary region each including:
      a base layer of a second conductivity type that is formed on a first main surface side of the drift layer;
      a source layer of the first conductivity type that is formed on the first main surface side of the base layer;
      a first contact layer of the second conductivity type that is formed directly adjacent to the source layer on the first main surface side of the base layer, and has a higher concentration of impurities of the second conductivity type than the base layer;
      a collector layer of the second conductivity type that is formed on a second main surface side of the drift layer; and
      at least one active trench gate directly adjacent to the source layer that passes through the base layer from the first main surface to reach the drift layer and that extends in a second direction orthogonal to the first direction;
   the diode region including:
      an anode layer of the second conductivity type that is formed on the first main surface side of the drift layer; and
      a cathode layer of the first conductivity type that is formed on the second main surface side of the drift layer; and
   in plan view, the boundary region having an occupancy rate of the source layer per unit area, the occupancy rate being smaller than an occupancy rate of the source layer per unit area in the IGBT region,
   in plan view, the boundary region having an occupancy rate of the first contact layer per unit area, the occupancy rate being smaller than an occupancy rate of the first contact layer per unit area in the IGBT region,
   each active trench gate is configured to be connectable to a gate drive voltage to form a channel in the respective base layer of the IGBT region and the boundary region,
   the source layer in the boundary region comprises plural source regions spaced from each other, and the source layer in the IGBT region comprises plural source regions spaced from each other, wherein along the second direction, the boundary region includes fewer of the source regions compared with the IGBT region, and
   in plan view, the first contact layer in the boundary region comprises plural first contact layers each spaced from each other by way of the base layer along the second direction.

2. The semiconductor device according to claim 1, wherein
   the diode region includes a second contact layer of the second conductivity type that is provided on the first main surface side of the anode layer and that has a higher concentration of impurities of the second conductivity type than the anode layer, and
   in plan view, the occupancy rate of the first contact layer per unit area in the boundary region is smaller than an occupancy rate of the second contact layer per unit area in the diode region.

3. The semiconductor device according to claim 1, wherein
   the IGBT region, the diode region, and the boundary region each further include
   an interlayer insulating film that is formed on the first main surface of the semiconductor substrate, and that has a contact hole for exposing the first main surface, and
   an emitter electrode that is formed on the first main surface of the semiconductor substrate with the interlayer insulating film interposed between the emitter electrode and the first main surface, and
   the boundary region includes a region on the first main surface where the source layer or the first contact layer is not formed, the region exposing the base layer, the base layer exposed being in electrical contact with the emitter electrode through the contact hole.

4. The semiconductor device according to claim 1, wherein
   in plan view, the occupancy rate of the source layer per unit area; gradually decreases from an IGBT region side toward the diode region.

5. The semiconductor device according to claim 1, wherein
   the boundary region includes a region on the first main surface where the source layer or the first contact layer is not formed, and the base layer is not formed in at least a part of the region.

6. The semiconductor device according to claim 5, wherein
the anode layer has a concentration of impurities of the second conductivity type, the concentration being lower than a concentration of impurities of the second conductivity type of the base layer.

7. The semiconductor device according to claim 6, wherein
the boundary region includes a region on the first main surface where the source layer or the first contact layer is not formed, the region including a region where the base layer is not formed and the anode layer is formed.

8. The semiconductor device according to claim 2, wherein
the IGBT region and the boundary region each include a plurality of the active trench gates arranged in the first direction, and
the diode region includes a plurality of first dummy trench gates that passes through the anode layer from the first main surface to reach the drift layer and that extends in the second direction and is arranged in the first direction.

9. The semiconductor device according to claim 8, wherein
the boundary region is divided into an IGBT operating region in which the source layer is disposed and the IGBT operation is performed, and
an IGBT non-operating region in which the source layer is not disposed and the IGBT operation is not performed, and
further includes a second dummy trench gate that is formed in at least a part of a region on the first main surface, the region where the base layer is not formed, and that extends from the first main surface to reach the drift layer, in the IGBT non-operating region, and
the second dummy trench gate is in contact with the first dummy trench gate in the diode region, and at least some of the plurality of trench gates disposed in the IGBT non-operating region.

10. The semiconductor device according to claim 8, wherein
the second contact layer in the diode region is disposed avoiding a portion in the diode region, the portion being on a line along the first direction, the line extending from a region where the source layer is disposed in the boundary region.

11. The semiconductor device according to claim 1, wherein
the boundary region has a width larger than a thickness of the semiconductor substrate.

12. The semiconductor device according to claim 5, wherein
the drift layer is formed in at least a part of the region where the source layer or the first contact layer is not formed.

* * * * *